United States Patent
Yun et al.

(10) Patent No.: US 7,268,945 B2
(45) Date of Patent: Sep. 11, 2007

(54) SHORT WAVELENGTH METROLOGY IMAGING SYSTEM

(75) Inventors: Wenbing Yun, Walnut Creek, CA (US); Yuxin Wang, Arlington Heights, IL (US)

(73) Assignee: Xradia, Inc., Concord, CA (US)

( * ) Notice: Subject to any disclaimer, the term of this patent is extended or adjusted under 35 U.S.C. 154(b) by 628 days.

(21) Appl. No.: 10/683,872

(22) Filed: Oct. 10, 2003

(65) Prior Publication Data

US 2004/0165165 A1 Aug. 26, 2004

Related U.S. Application Data

(60) Provisional application No. 60/417,726, filed on Oct. 10, 2002.

(51) Int. Cl.
*G02B 27/44* (2006.01)
(52) U.S. Cl. .................. 359/565; 359/576; 359/361; 378/34
(58) Field of Classification Search ................ 359/565, 359/576, 361
See application file for complete search history.

(56) References Cited

U.S. PATENT DOCUMENTS

| | | | |
|---|---|---|---|
| 5,177,774 A * | 1/1993 | Suckewer et al. ............. | 378/43 |
| 6,128,364 A * | 10/2000 | Niemann ....................... | 378/43 |
| 6,885,503 B2 | 4/2005 | Yun et al. | |
| 6,914,723 B2 | 7/2005 | Yun et al. | |
| 6,917,472 B1 | 7/2005 | Yun et al. | |
| 2003/0058529 A1* | 3/2003 | Goldstein ................... | 359/361 |
| 2006/0049355 A1* | 3/2006 | Bloom ................... | 250/339.13 |

* cited by examiner

*Primary Examiner*—Fayez G. Assaf
(74) *Attorney, Agent, or Firm*—Houston Eliseeva LLP

(57) ABSTRACT

An extreme ultraviolet (EUV) AIM tool for both the EUV actinic lithography and high-resolution imaging or inspection is described. This tool can be extended to lithography nodes beyond the 32 nanometer (nm) node covering other short wavelength radiation such as soft X-rays. The metrology tool is preferably based on an imaging optic referred to as an Achromatic Fresnel Optic (AFO). The AFO is a transmissive optic that includes a diffractive Fresnel zone plate lens component and a dispersion-correcting refractive lens component. It retains all of the imaging properties of a Fresnel zone plate lens, including a demonstrated resolution capability of better than 25 nanometers and freedom from image distortion. It overcomes the chromatic aberration of the Fresnel zone plate lens and has a larger usable spectral bandwidth. These optical properties and optical system designs enable the development of the AFO-based AIM tool with improved performance that has advantages compared with an AIM tool based on multilayer reflective mirror optics in both performance and cost.

17 Claims, 24 Drawing Sheets

SHORT WAVELENGTH METROLOGY IMAGING SYSTEM

RELATED APPLICATIONS

This application claims priority to U.S. Provisional Appl. No. 60/417,726, filed Oct. 10, 2002, which is incorporated herein by reference in its entirety.

BACKGROUND OF THE INVENTION

Development of aerial inspection monitor (AIM) systems is critical to the effort to develop semiconductor processing techniques in the extreme ultraviolet (EUV). These AIM systems are used for inspection of the masks for the EUV.

The challenge surrounds the fact that the EUV masks are phase shift masks. As a result, actinic imaging systems are required to find any defects. Magnification and detection of images from the masks are difficult in these short wavelengths where standard optics do not work.

Currently actinic systems for EUV mask inspect utilize reflective optical systems that are expensive and inefficient. Moreover, the optical trains associated with these systems are complex.

SUMMARY OF THE INVENTION

The present invention concerns extreme ultraviolet (EUV) AIM Tool Development for both the EUV actinic lithography and high-resolution imaging or inspection. This tool concept can be extended to lithography nodes beyond the 32 nanometer (nm) node covering other short wavelength radiation such as soft X-rays.

The inventive AIM tool is preferably based on an imaging optic referred to henceforth as an Achromatic Fresnel Optic (AFO). The AFO is a transmissive optic that includes a diffractive Fresnel zone plate lens component and a dispersion-correcting refractive lens component. It retains all of the imaging properties of a Fresnel zone plate lens, including a demonstrated resolution capability of better than 25 nanometers and freedom from image distortion. It overcomes the chromatic aberration of the Fresnel zone plate lens and has a larger usable spectral bandwidth. These optical properties and optical system designs enable the development of the AFO-based AIM tool with improved performance that has advantages compared with an AIM tool based on multilayer reflective mirror optics in both performance and cost:

This system can provide a high resolution microscope option with 30 nanometer (nm) resolution, sufficient even for 32 nm lithography node. Further, a 25 nm resolution is achievable.

It can employ a simple optical train using only one AFO lens to achieve a large magnification required for direct recording of the magnified image by a high-throughput charge-coupled (CCD) camera, resulting in a high overall system throughput.

It can operate at any actinic wavelength with a desired spectral bandwidth to match that selected by stepper manufacturers in the 12.6-14 nm spectral region. Although 13.4 nm is used as the design wavelength, any wavelength within the spectral region can be designed. In addition, the AFO-based optics will not image visible light.

It can implement and switch easily between the AIM lithography emulation and high-resolution microscope modes.

The simple optical train and the relatively low number of optics involved means that the AIM tool will be reliable and easy to maintain.

The AFO will be fabricated on a silicon membrane, which serves as a natural barrier to hermetically isolate masks from the rest of the tool components to practically eliminate contamination during AIM imaging.

In general, according to one aspect, the invention features an imaging system using short wavelength radiation. It comprises an achromatic Fresnel objective lens.

The short wavelength radiation is preferable extreme ultraviolet radiation or soft x-ray radiation.

In general, according to another aspect, the invention features system for actinic imaging metrology of short wavelength lithography masks comprising an achromatic Fresnel objective lens.

In general, according to another aspect, the invention features achromatic Fresnel lens for radiation with a 13 to 14 nanometer wavelength. It comprises a zone plate made from molybdenum (Mo), niobium (Nb), Technetium (Tc), or Ruthenium (Ru).

In general, according to another aspect, the invention features a method for imaging 13 to 14 nanometer wavelength. The method comprises using a silicon or copper refractive lens to correct the chromatic aberration of a zone plate to increase a bandwidth for 13 to 14 nm wavelength radiation.

In general, according to still another aspect, the invention features optical system comprising an extreme ultraviolet radiation source, a spectral filter, a reflective condenser, an aperture, an objective lens, and a spatially resolved detector.

In embodiments, the source is a laser-plasma source or a gas discharge source. Emission from a copper target is used. The spectrum filter is a multilayer filter. The condenser is a multilayer coated spherical surface.

Preferably, a virtual source of the extreme ultraviolet radiation source formed by the condenser and the region of interest of the mask resides on a Rowland circle determined by the condenser.

In one example, the objective lens comprises an achromatic Fresnel optic with a silicon or copper refractive lens.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The AIM tool requires a high performance imaging system operating at an actinic EUV wavelength, i.e., about 13.4 nm, with adequate spatial resolution to support the imaging and analysis needs of patterned and unpatterned EUV masks for 45 nm and 32 nm lithography nodes. In addition, it preferably has the following optical properties: (1) a usable spectral bandwidth of 2% to match the expected spectral bandwidth of a 4× EUV stepper/scanner; (2) a high throughput for either fast data collection or minimizing EUV source power requirement or both; and (3) a large single stage magnification for designing a simple and high throughput optical system because EUV radiation can be recorded directly using a back-thinned CCD detector with high quantum detection efficiency.

These performance criteria provide advantages relative to conventional systems. Two stage magnification is generally required for mirror based imaging optics and standard zone plate lens-based imaging systems are limited by chromatic aberration. In contrast, the AFO lens offers all the optical properties explained above and can be fabricated using established processing technologies. Although in some embodiments of the invention, conventional zone plate optical elements are used in place of the AFO.

Zone plate lenses currently provide the highest resolution for focusing electromagnetic radiation of any wavelength. X-ray microscopes using a zone plate in a single stage magnification scheme have achieved 25 nm resolution with soft x rays with wavelengths between 2 and 5 nm at synchrotron radiation sources. Zone plate lens further work well in the short wavelength radiation spectral that covers the range of 0.02-20 nm.

However, the zone plate lens is incompatible with a broadband radiation source since chromatic aberration would severely reduce the achievable resolution. The AFO maintains all the advantages of a zone plate such as; 1) simple single lens design; 2) direct imaging onto a CCD; 3) well understood fabrication; and 4) no obscuration of 6 degree reflection. The AFO objective is a simple two-element design and the fabrication, which, while more complex than a simple zone plate, is manageable with nanometer level tolerances. The AFO technology will resolve all the disadvantages of a zone plate since the AFO designed for the AIM tool has about 0.5 nm bandwidth and the AFO for the high-resolution mode has about 0.25 nm bandwidth. By using a blazed Fresnel zone plate, a combined efficiency of about 30% can be achieved for the AIM objective. The AFO can also be combined with a visible light objective to provide compatibility with visible light imaging. Finally, the optical train has a total length of preferably less than 1 meter.

Figure 1:
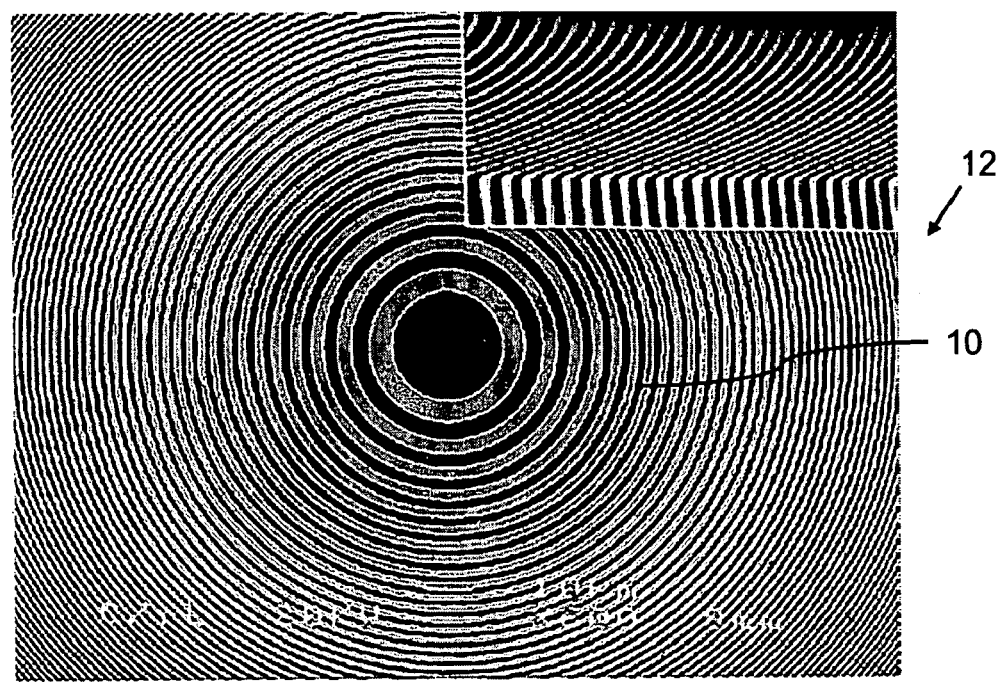
FIG. 1 is a plan view of a zone plate lens.

A brief background on Fresnel zone plates may be helpful. As shown in FIG. 1, a Fresnel zone plate 12 is a diffractive imaging optic, and comprises a set of concentric rings 10 with the ring width (zone) decreasing with radii defined by $$r_n^2 = n\lambda f_Z + an^2\lambda^2, \quad (1)$$

where n is the zone number index, and $f_Z$ is the focal length, and a=0.25 for imaging an object at infinity. In the simplest version, these rings alternate between transparent and an opaque materials. This way, the opaque rings block light that would arrive at the focal point out of phase with respect to the light passing through the transparent areas. Such zone plates, called amplitude zone plates, have a maximum theoretical efficiency of about 10%. Instead of opaque rings 10, one can replace them with material that shifts the phase of the light by π. This results in a phase zone plate, with maximum theoretical efficiency of about 40%. The amplitude and phase zone plate 12 are both binary zone plates because of their binary zone profile. Alternatively, the square profile of a phase zone plate can be replaced by a graduated one that shifts the exact phase error at each point on the lens. The resulting blazed zone plate, which is an extreme case of a Fresnel lens, has a maximum theoretical efficiency of 100%.

Zone plates behave like lenses with a focal length of $$f_Z = \frac{2R\Delta R}{\lambda}, \quad (2)$$

where 2R is the diameter of the zone plate 12 and ΔR is the width of the finest, outermost zone 10. For imaging parallel line structures such as IC circuits, the line resolution is simply ΔR, the same as the outer zone width. In practice, zone widths as small as ΔR=18 nm have been fabricated for λ=2-5 nm x-ray radiation, delivering better than 25 nm resolution, while zone widths of ΔR=50 nm have been used for shorter wavelength (λ<0.5 nm) radiation. Fresnel zone plates therefore deliver the highest resolution for electromagnetic radiation of any wavelength. In resolution, Fresnel zone plates currently exceed the requirements for AIM applications by a large margin.

The number of zones N determines the required illumination monochromaticity, or spectral bandwidth:

$$\frac{N}{2} = \frac{R}{4\Delta R} = \frac{\lambda}{\Delta\lambda}. \quad (3)$$

Generally, Fresnel zone plates 12 by themselves are not attractive for imaging applications with a broad-band radiation source: in order to have large fields of view, which scale as the optic diameter if aberrations are to be minimized, and high spatial resolution ΔR, the spectral bandwidth λ/Δλ will be extremely small. For the AIM tool with the 32 nm node size, it is desirable to have an objective with more than 1.5 mm focal length and 77 nm resolution. The objective in one embodiment has a 262.5 um diameter and 76.7 nm outer zone width, and over 800 zones. The bandwidth is therefore less than 0.02 nm. Its bandwidth may be too narrow for the some application, however, without the chromatic aberration correction.

Figure 2:
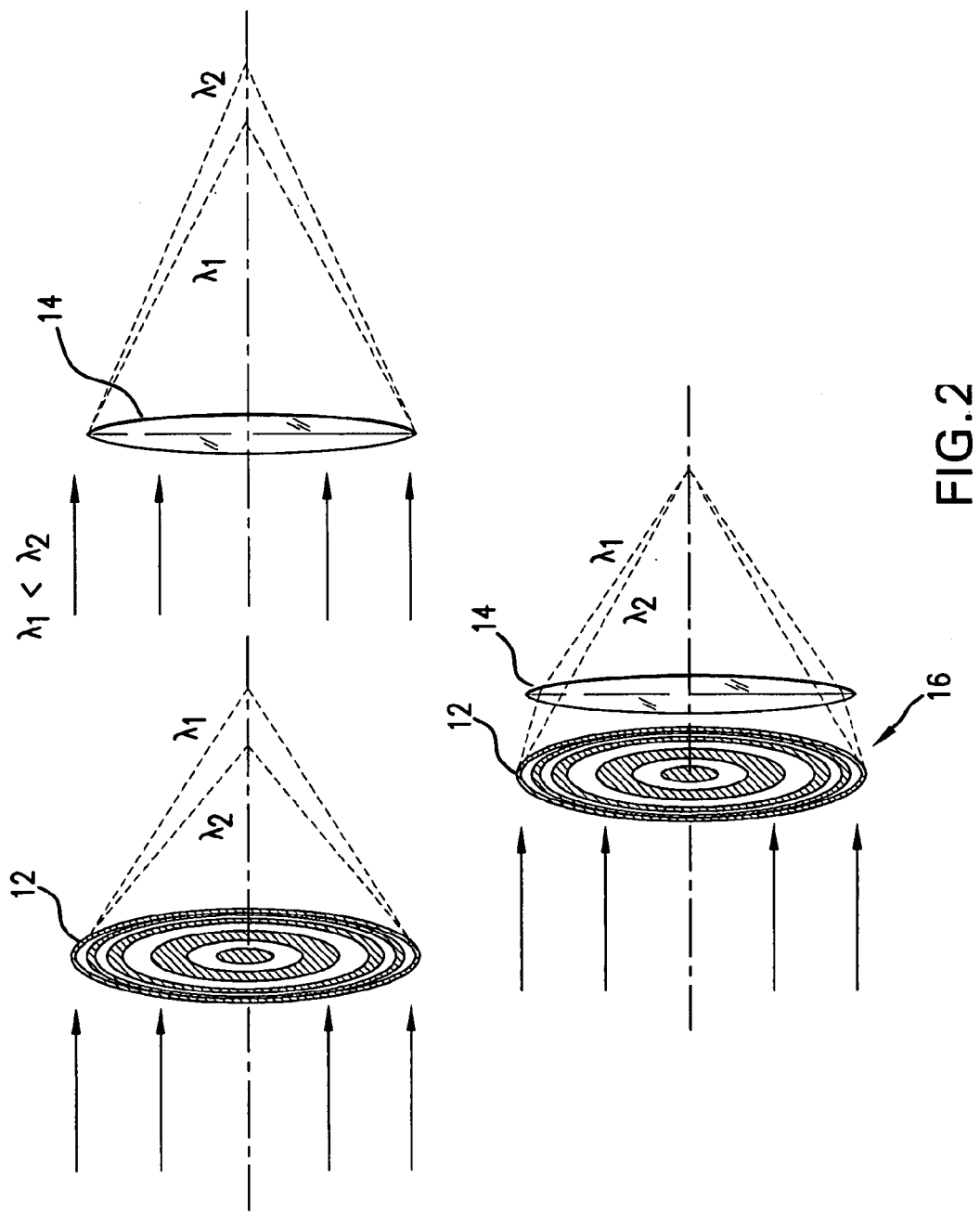
FIG. 2 is a schematic diagram showing how an AFO overcomes the chromatic aberration.

The AFO overcomes the chromatic aberration problem by using a refractive element with the opposite dispersion characteristic as the zone plate. The method is schematically illustrated in FIG. 2, which illustrates the AFO's operation. With radiation of two wavelengths $\lambda_1 < \lambda_2$, the focal length of the zone plate 12 varies as $f_z(\lambda_1) > f_z(\lambda_2)$. If we select a material with $\delta(\lambda_1) > \delta(\lambda_2)$, the focal length of a convex refractive lens 14 would vary as $f_r(\delta(\lambda_1)) < f_r(\delta(\lambda_2))$. We can combine the Fresnel zone plate 12 and the refractive lens 14 such that the combined focal length $f_c$ is the same for both wavelengths.

With this compound lens 16, focusing is achieved almost completely by the diffractive Fresnel zone plate 12, thus inheriting its advantages of high numerical aperture, high resolution, and high efficiency. The function of the refractive lens 14 is to recombine the radiation of different wavelengths dispersed by the zone plate 12, thereby correcting the chromatic aberration. This refractive Fresnel lens 14 operates on the same principle of refraction as a conventional lens for visible light. When used within the EUV spectrum, however, the difference in refractive properties requires a Fresnel lens to minimize the total lens thickness to reduce absorption. The focal length of a refractive Fresnel lens 14 with a single concave lens surface is given by $f_R = R_C/\delta$, where $\delta = -\alpha\lambda^2 f_1(\lambda)$. With its dependence on $\lambda^2$ and $f_1(\lambda)$, the refractive lens 14 is a chromatic lens and cannot be used alone as a wide-band imaging optic. But its chromatic aberration can be exploited to cancel that of a zone plate 12.

Figure 3:
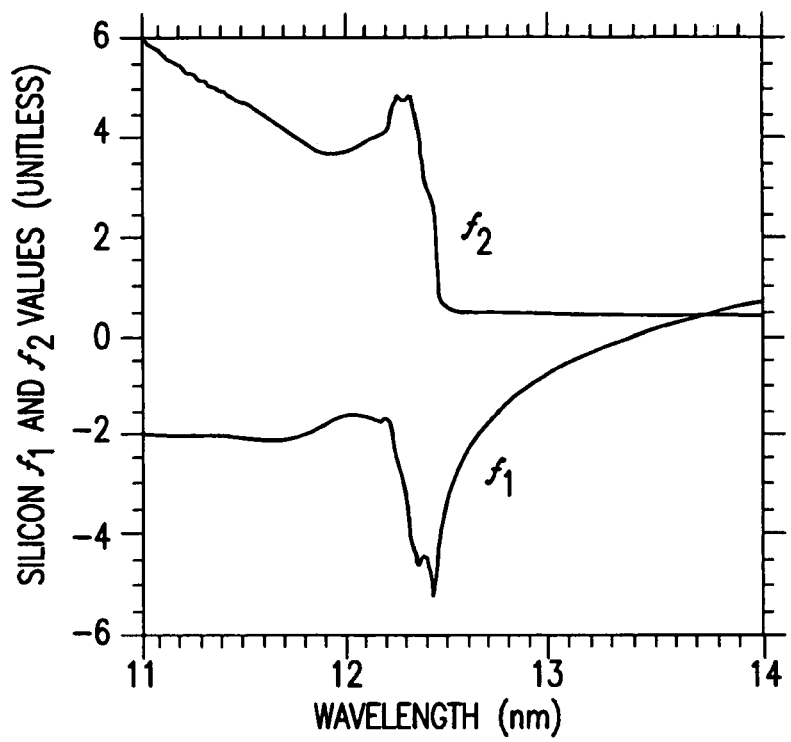
FIG. 3 is a plot of the values of $f_1$ and $f_2$ as a function of wavelength (nm) near silicon L-edge.

Referring to FIG. 3, for silicon in the 12.6 nm to 14 nm wavelength region, the decrease in $f_1$ means that the focal length of a concave refractive Fresnel lens increases with wavelength, which is opposite to the wavelength dependence of the zone plate's focal length. FIG. 3 shows the values of $f_1$ and $f_2$ near Silicon L-edge. The absorption term, $f_2$, exhibits a step-like function while the refraction term, $f_1$, is of a "V" shape. The $f_2$ values were measured experimentally, and $f_1$ was calculated from the $f_2$ values using the Kramers-Kronig relations. The strong dependence of $f_R$ on wavelength (large dispersion in optics terminology) not only permits its use for correcting the chromaticity of zone plate, but also makes its fabrication practical.

The achromatic condition can be derived by considering the variation of the compound lens 16 as the wavelength is changed from λ to λ+Δλ. The focal length of a Fresnel zone plate is then given by $$f'_Z \approx f_Z \frac{1}{1 + \frac{\Delta\lambda}{\lambda}} \quad (4)$$

With the refractive lens, we must consider the variation both in $\lambda^2$ $$\lambda^2 \rightarrow \lambda^2 + 2\lambda\Delta\lambda + (\Delta\lambda)^2, \quad (5)$$

and $f_1$. The simplest approximation we can make to $f_1$ is to incorporate a linear dispersive term and write it as $$f_1 \rightarrow f_1 + \frac{\Delta f_1}{\Delta\lambda}\Delta\lambda. \quad (6)$$

Ignoring terms of order $[\Delta\lambda/\lambda]^2$ and higher, the focal length of a refractive lens varies as:

$$f'_R \approx f_R \frac{1}{1 + 2\frac{\Delta\lambda}{\lambda} + \frac{\Delta f_1}{f_1}}. \quad (7)$$

If the two lenses are placed in close proximity to each other, i.e. when their separation is much smaller than their focal lengths, their reciprocal focal lengths can be added:

$$\frac{1}{f_C} = \frac{1}{f'_Z} + \frac{1}{f'_R} = \frac{1}{f_Z} + \frac{1}{f_R} + \frac{\Delta\lambda}{\lambda}\left[\frac{1}{f_Z} + \frac{1}{f_R}(2 + D)\right], \quad (8)$$

where $D \equiv (\Delta f_1/f_1)/(\Delta\lambda/\lambda)$ characterizes the dispersion. If we set the term in the bracket to zero, the focal length becomes independent of Δλ: that is, we have an achromat. The achromat condition can be written as $$\frac{f_R}{f_Z} = -(2 + D) \quad (9)$$

The magnitude of the dispersion term D can be significantly larger than 2, thus enabling a longer focal length, and consequently a larger, easier-to-fabricate radius of curvature for the refractive lens component 14. In this case the radius of curvature $R_C$ can be written as:

$$R_C \approx \alpha \times (2R\Delta R) \times \lambda^2 \times \frac{\Delta f_1}{\Delta \lambda}. \quad (10)$$

Figure 4:
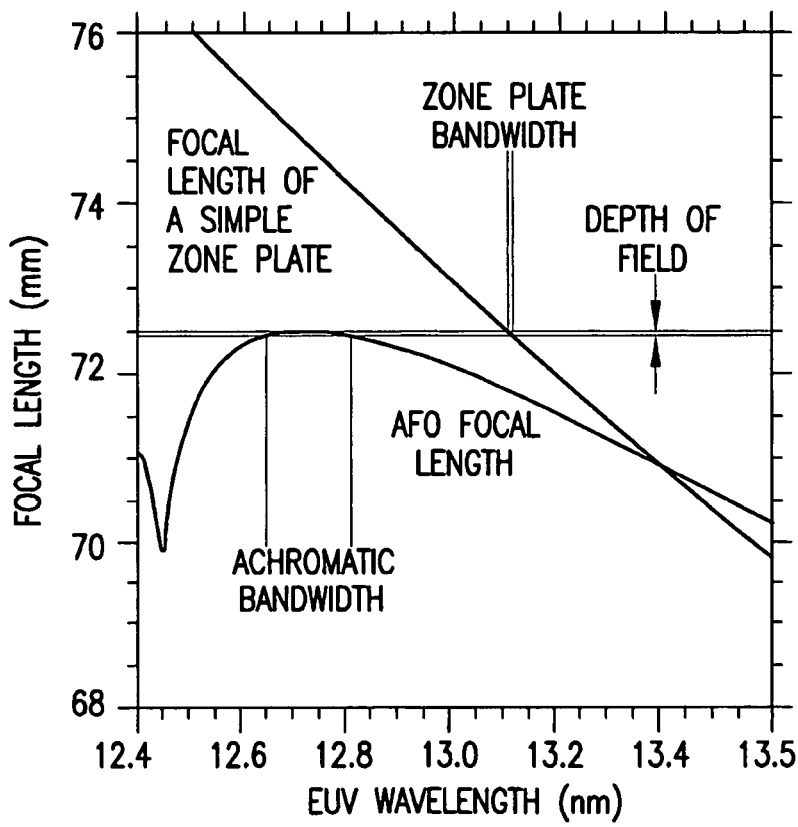
FIG. 4 is a plot of the focal length (mm) of the compound lens 16 as a function of wavelength (nm)

This relationship indicates that the radius of curvature of the refractive lens 14 is proportional to the zone plate diameter 2R, outer most zone width $\Delta R$, the square of the wavelength, and the dispersion property of the material. The effect of chromatic aberration cancellation is illustrated in FIG. 4, where the focal length of the compound lens is plotted as a function of wavelength. This shows the effect of combining a zone plate 12 and a silicon refractive lens 14 operating near the silicon L-edge (the depth of field is not to scale). From the figure, we observe that the focal length of the simple zone plate is inversely proportional to the wavelength and its graph is the nearly straight diagonal line. When a refractive dispersion compensation element is combined with the zone plate, the straight line is bent, and becomes flat within a relatively large range of wavelengths. This is our achromatic bandwidth. This technique typically results in a factor of 10 to 1000 gain in bandwidth.

In other implementations, the refractive lens 14 is fabricated from copper.

The AFO 16 retains many of the well-established desirable imaging properties of a zone plate but overcomes its chromatic aberration problem, considered as its main limitation. In addition to the increased achromatic bandwidth discussed in the previous section, its imaging properties of importance here include numerical aperture, focusing efficiency (throughput), focal length and working distance, and image aberrations.

The numerical aperture and spatial resolution of the AFO 16 are essentially identical to its zone plate lens component 12 because the refractive lens 14 component mainly functions as a chromatic corrector. The numerical aperture (NA) of AFO 16 is given as $NA = \lambda / 2\Delta R$.

For a given wavelength $\lambda$, the numerical aperture of AFO 16 is inversely proportional to the outermost zone width of the AFO's zone plate lens component, $\Delta R$. Using the above expression, Table 3 lists the minimum $\Delta R$ values required to meet certain resolution requirements.

TABLE 3

Minimum zone width required to meet certain the NA and resolution requirements.

| Imaging Mode | AIM | | High-Resolution | |
| --- | --- | --- | --- | --- |
| | 45 nm Node | 32 nm Node | 45 nm Node | 32 nm Node |
| NA Required | 0.0625 | 0.0875 | 0.21* | 0.27* |
| Resolution Required (nm) | 108 | 76.6 | 32 | 25 |
| Minimum $\Delta R$ Required (nm) | 108 | 76.6 | 32 | 25 |

The focusing efficiency of AFO 16 is equal to the product of the zone plate lens 12, the refractive lens component 14, and the supporting substrates. Because zone plates have been used mainly for soft x-ray applications until recently and since it is difficult to fabricate phase zone plates for the soft x-ray energy region (~250-1000 eV), it has been widely and erroneously assumed that the zone plate's efficiency is limited to 10%. For x-ray energies greater than 2 keV, the zone plate's focusing efficiency is often dominated by the phase effect and a focusing efficiency close to 30% has been demonstrated by several groups by suitably shaping the zone profile away from the square wave profile.

For the 13-14 nm spectral region of interest, the zone plate lens component 12 can be fabricated with a high focusing efficiency. The main reason for this is that several materials, such as molybdenum (Mo), niobium (Nb), Technetium (Tc), and Ruthenium (Ru), can introduce a significant phase shift to the incident radiation with little attenuation. For example, a 75-nm thick Mo zone plate with a square zone profile has a calculated focusing efficiency of 32%. By shaping the zone profile, it is possible to make a zone plate lens component with a focusing efficiency exceeding 50%. In fact, the small 75 nm thickness required for making a phase zone plate means that the shaping of the zone profile to achieve high focusing efficiency for the EUV radiation should be much easier than that for higher energy x-rays.

The focusing efficiency of the refractive lens component is determined by the average transmission, and thus depends on its thickness. The 1/e absorption length of silicon is about 0.5 micrometers (um). A Fresnel lens with maximum thickness of 0.5 um will provide an average transmission of about 60% and one with maximum thickness of 0.25 um allows about 80% average transmission. In addition, we must include the attenuation of the focusing beam by the supporting membrane on which the zone plate and refractive lens components are made. It has been established that a Si membrane of 0.1 um thickness would provide sufficient strength to support the optics. The AFO designed for the 45 nm node size requires a single support membrane with about 84% transmission, while the AFOs designed for the 32 nm node and the high resolution mode require two 0.1 um thick support membranes with an total transmission of 70%. Therefore, it may be possible and practical to fabricate AFOs with a focusing efficiency of 30%.

The focal length of the AFO is essentially equal to that of its zone plate lens element. For large image magnification applications, the working distance of the AFO is approximately equal to its focal length. Equation (2) shows that for a given wavelength $\lambda$ and outermost zone width $\Delta R$, the focal length increases linearly with the diameter of the zone plate lens or the total number of zones N. Without the AFO concept, a simple zone plate would have a focal length too short to be useful for the EUV AIM tool with a 2% bandwidth, especially when $\Delta R$ approaches $\lambda$ for high-resolution application. The AFO concept allows us to design AFOs for various applications with reasonable focal lengths and working distances.

The AFO concept effectively corrects chromatic aberration. As a nearly ideal thin lens, it also has considerable advantages in its lack of monochromatic aberrations. For a zone plate and therefore an AFO, the distortion term in the Seidel aberration polynomial is zero, resulting in aberration-free images. Furthermore, it does not have spherical aberration if the zones of its zone plate lens component are correctly positioned, as we will discuss below.

For a Fresnel zone plates and an AFO, spherical aberration occurs only when it is used for a configuration different from the designed imaging conjugate positions. It is therefore easy to design and fabricate an AFO that is free from spherical aberration with the imaging geometry is fixed, as in the case of the proposed AIM tool for both the AIM and high-resolution modes.

Figure 5:
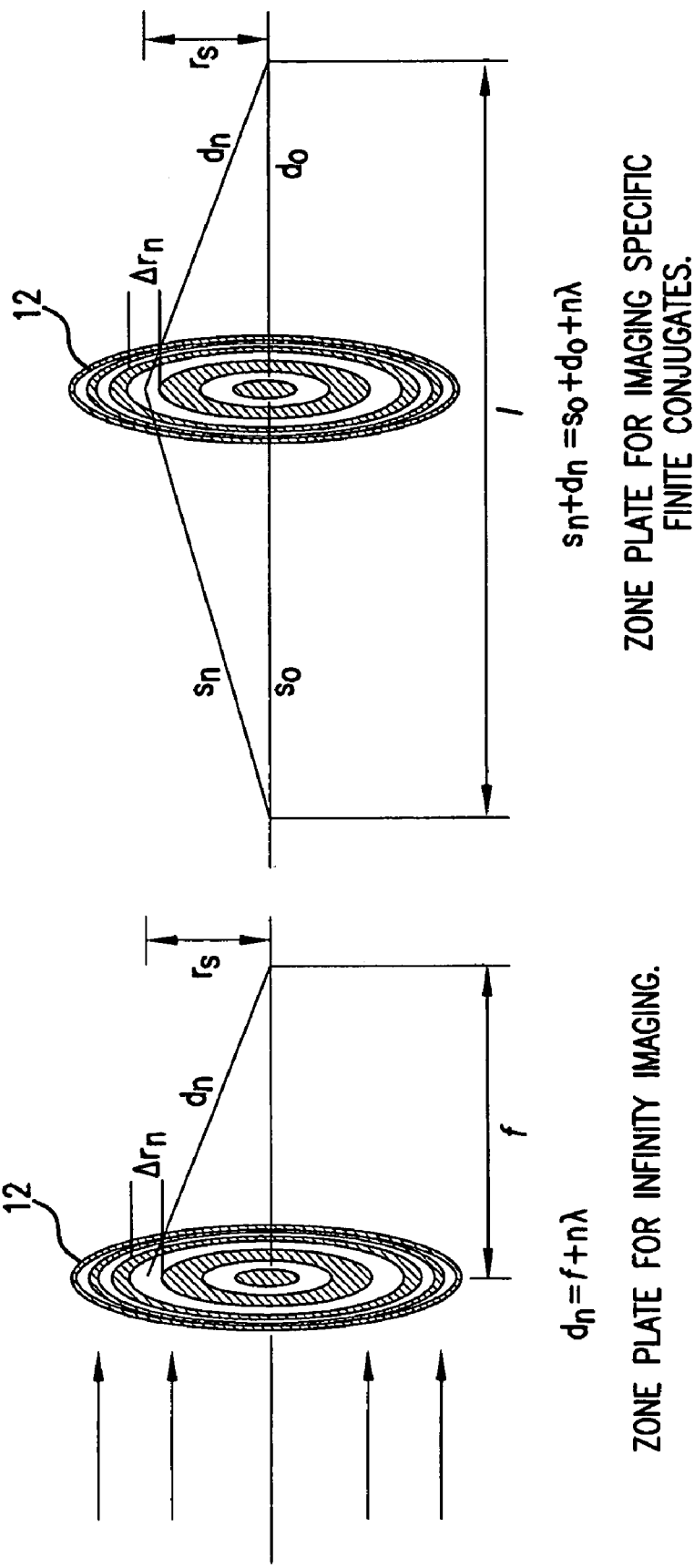
FIG. 5 illustrates a zone plate lens imaging an object at infinity and imaging fixed finite conjugate positions.

Referring to FIG. 5, most zone plate lenses 12 are designed for imaging an object at infinity (a). When these zone plates are used to image finite conjugates, spherical aberration will appear when the zone plate numerical aperture is greater than about 0.1. We could instead compute zone placement specifically for imaging fixed finite conjugate positions. Then the spherical aberration can be eliminated at this imaging geometry.

In practice, one will compute the zone positions analytically for the exact object and imaging planes, then write the zone plate with an electron beam (e-beam) writer. The resulting optic is free from spherical aberration at the designed imaging geometry. In comparison, an aspherical surface is often required for reflective optic to correct spherical aberration.

Figure 6:
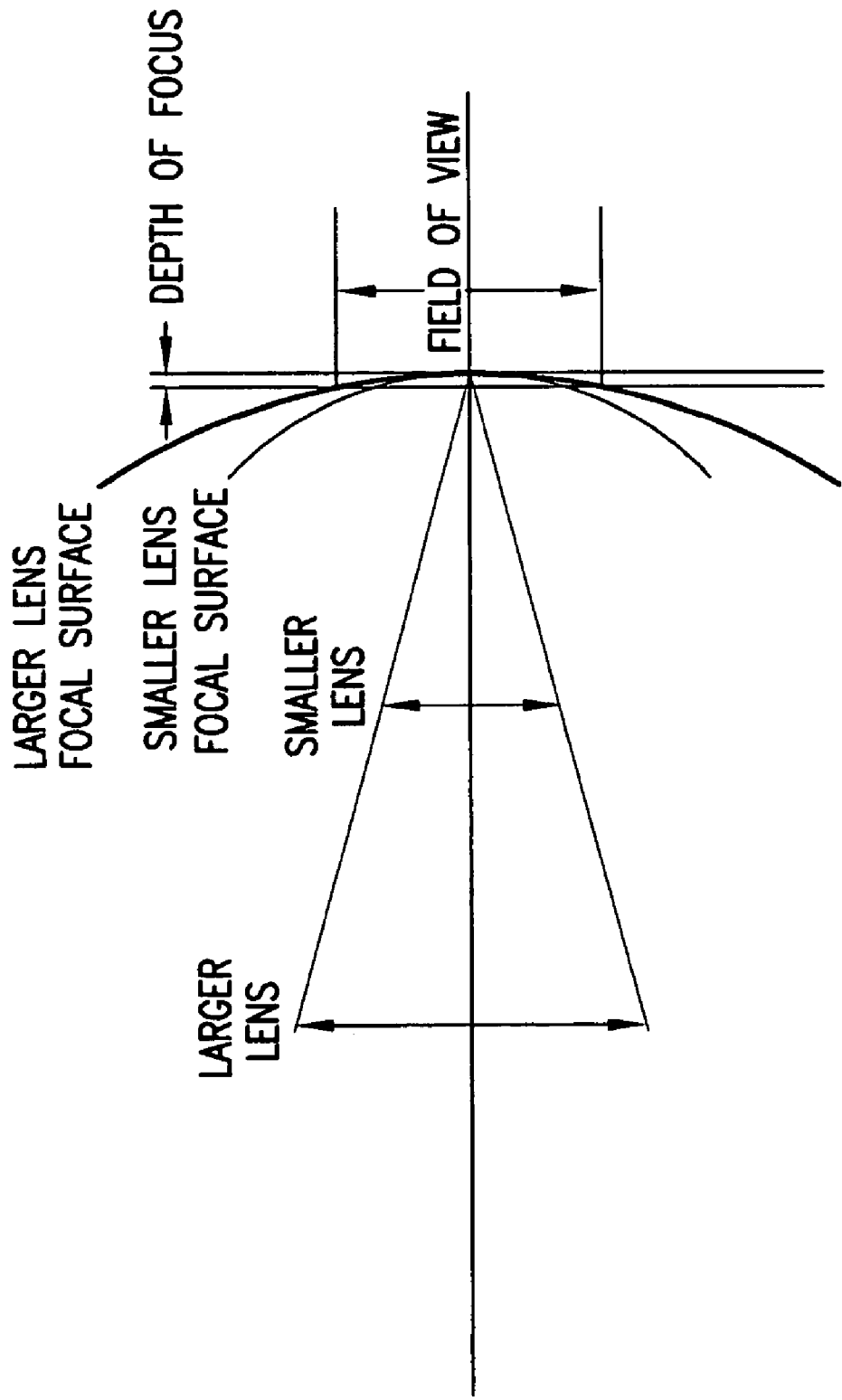
FIG. 6 illustrates the reduction of field curvature and astigmatism aberration.

Astigmatism/field curvature aberration occurs for off-axis object points and generally increases with field of view. For a given field of view and a given numerical aperture, the astigmatism/field curvature aberration can be minimized. Since the AFO 16 can be made sufficiently large without chromatic and spherical aberrations, the field curvature and astigmatism aberration can be reduced to an acceptable level, as illustrated in FIG. 6, which illustrates the reduction of field curvature and astigmatism aberration. To obtain the field of view indicated in the figure, the smaller lens is not sufficient. When a larger lens, with the same numerical aperture is used, the field curvature becomes less in the field of view. Thus, the field curvature and astigmatism can be overcome by making the lens larger while maintaining the same field of view. Analysis for the AFOs indicates that they meet most wave front error requirements.

It is well known in optical engineering that coma can be eliminated or reduced by placing an appropriate stop 18 at or near the natural position. The telecentric stop 20 placed at the back focal plane of the AFO will also provide sufficient coma correction. With this stop 20, the coma is reduced to a negligible level for both AFO 16 for the AIM and high-resolution modes. As an example, for the AFO designed for the AIM mode with 45 nm node size, the tangential coma is 0.029 micrometers ($\mu m$) without any correction. When the telecentric stop 20 with the same diameter as the AFO 16 is place in the back focal plane, the coma is reduced to below 0.001 $\mu m$. The stop 20 has similar effects for AFO designed for other imaging modes.

Figure 7:
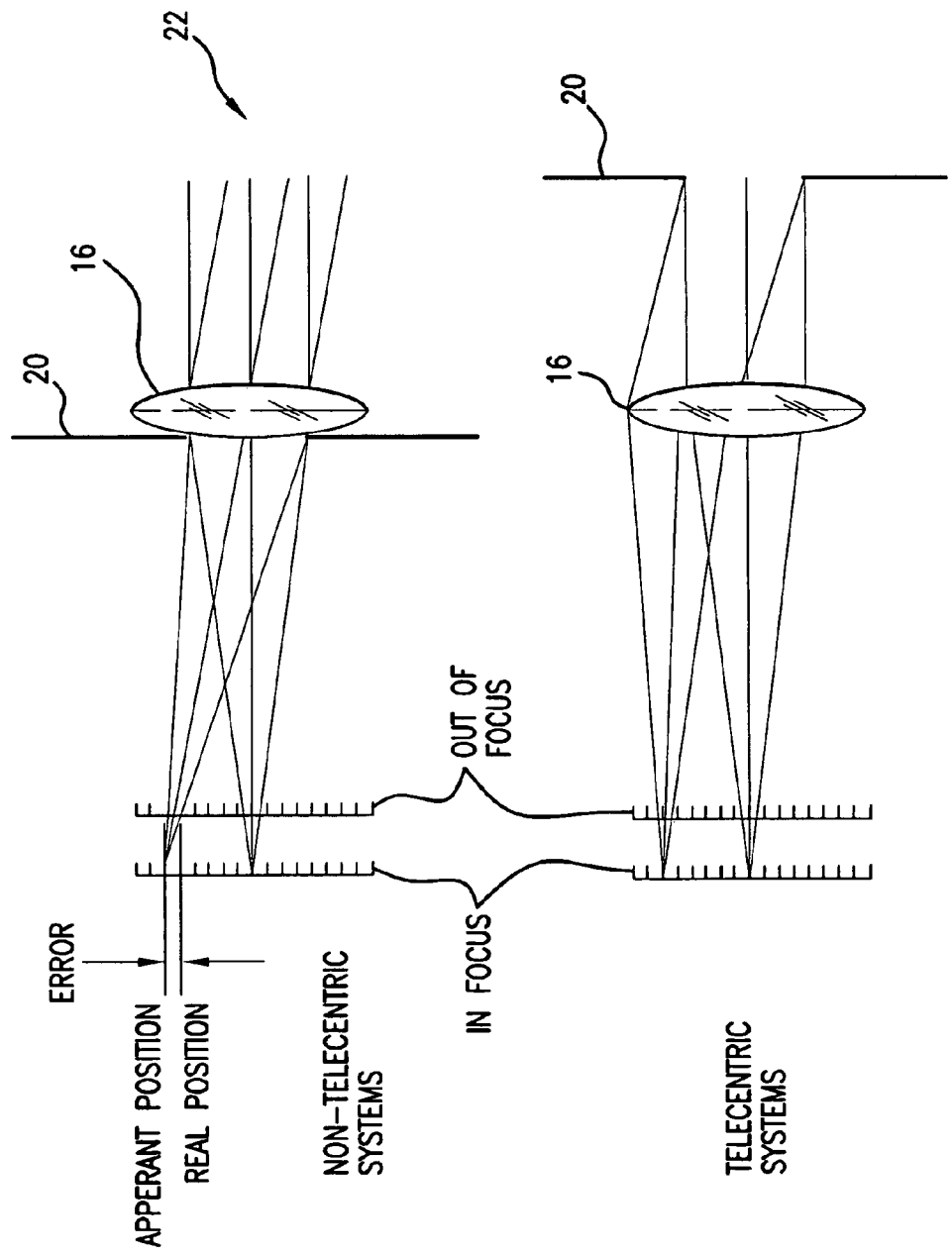
FIG. 7 illustrates the use of a stop to obtain telecentricity.

Telecentricity is achieved by the widely used technique of placing the stop 20 at the back focal plane of the AFO objective 16. This technique is illustrated in FIG. 7. Specifically, as illustrated in a non-telecentric imaging system, a small defocus causes a position change of the apparent image. This position error can be reduced and eliminated by using telecentric stop 20. In the non-telecentric system, an object in the out-of-focus plane will be imaged to a position on the focused plane with a shift in the transverse direction. This position error is reduced and can be eliminated in a telecentric system by the use of the telecentric stop.

It is important that all the zones in the zone plate lens component be placed with adequate accuracy. The required zone placement accuracy can be achieved using advanced e-beam lithography tools, such as the Nanowriter at Lawrence Berkeley National Laboratory. Random zone placement error as well as drift-reset errors generally does not degrade the resolution of the AFO but rather reduced peak intensity of the point spread function and contribute to flare. Typically the Strehl ratio is reduced from 1 to 0.98 when the errors are 20% of the outer zone width, and resulting in about 2% flare. Larger zone placement error of 40% of the outer zone width results in a Strehl ratio of 0.94 and 4% flare. The Nanowriter has a zone placement accuracy of better than 10 nm. We therefore expect less than 1% flare for the AFO designed for the AIM mode and about 3% flare for the high-resolution mode.

Fabrication of AFO

Figure 8:
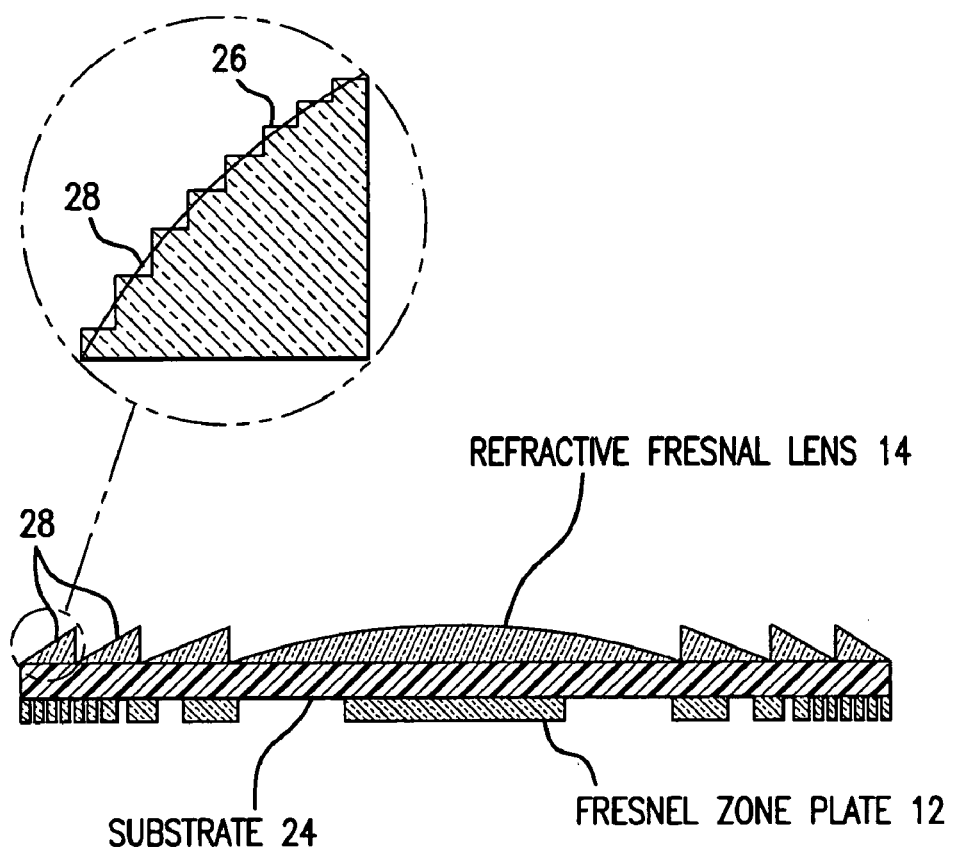
FIG. 8 is a side plan view illustrating the fabrication of the refractive lens 14 on a substrate 24 of the zone plate 12.

The dispersion properties of silicon near its L-edge of 12.6 nm are used for fabricating the refractive lens 14. Moreover, zone plate fabrication techniques have been largely developed using silicon or $Si_3N_4$ as a supporting membrane or substrate 24, it is therefore very convenient to fabricate the refractive lens 14 on the opposite side of the zone plate 12. This is shown in FIG. 8. Specifically, the refractive lens 14 is fabricated directly on the silicon substrate 24 of the zone plate 12. A stepped structure 26 is preferably used to approximate the curved surface profile 28 of the refractive lens 14. This fabrication scheme increases the overall throughput of the lens by eliminating one substrate layer and also maintains the two elements in constant alignment during its operational life.

Zone plate fabrication techniques have been well established. Currently the highest resolution zone plates are produced by electron-beam lithography techniques. For focusing EUV radiation, a binary zone plate 12 made from about 50-100 nm, preferably about 70 nm, thick Mo can provide about 30% efficiency. The efficiency can be further increased to a maximum of 70% with a blazed Mo zone plate in other embodiments.

Figure 9A:
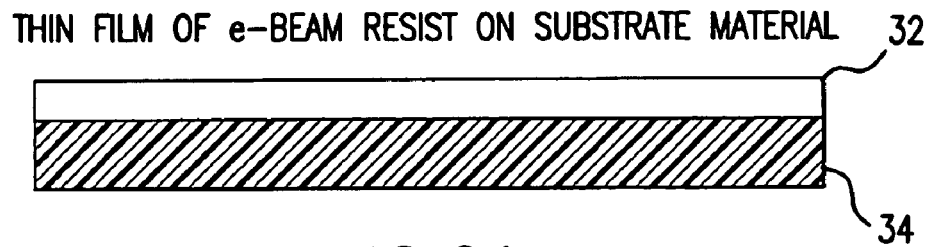
FIGS. 9A-9D illustrate a gray-scale lithography technique for fabricating the refractive lens component 14 of the AFO 16.
Figure 9B:
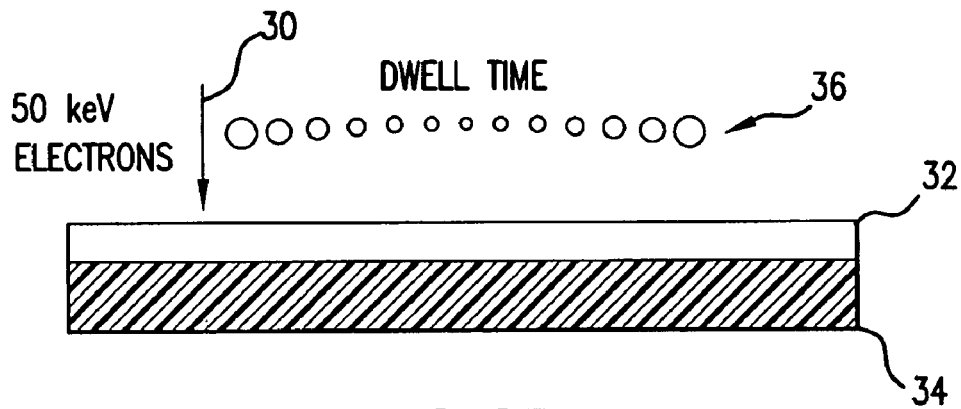
Figure 9C:
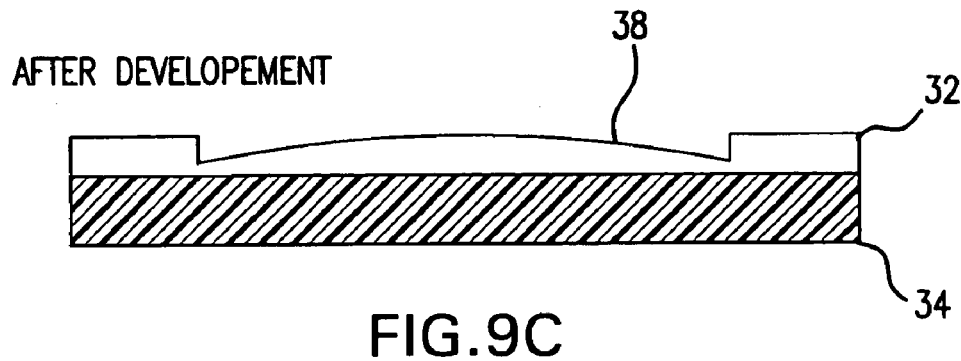
Figure 9D:
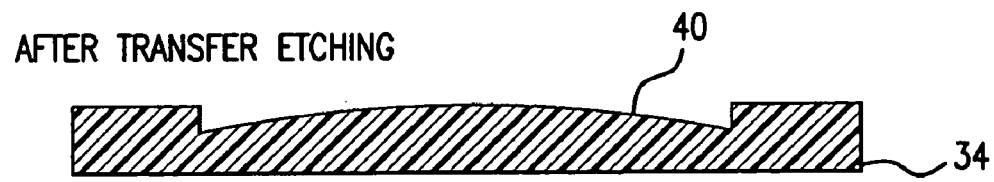

Fabrication of smooth structures such as the refractive Fresnel lens has been experimentally demonstrated by a number of researchers. One promising approach is to use the gray-scale lithography technique shown FIGS. 9A-9D. With this method, the pattern is generated by electron beam 30 in resist 32 on substrate 34 with a continuously varying dosage 36 that corresponds to the desired pattern profile. When the development process is complete, as shows in FIG. 9C, a smoothly varying profile 38 can be obtained. This is transferred into the substrate 34 using a etch process, such as reactive ion etching to thereby form the profile 40 in the substrate 34, as shown in FIG. 9D. This substrate can be a separate substrate that is bonded to the zone plate substrate 24 or substrate 24 itself on which the zone plate lens is also directly fabricated. Structures produced with this technique are currently on the scale of many micrometers, larger than the 1 micrometer to submicrometer um scale needed for the AFO 16. However, we believe this technique can be readily scaled down proportionally to the required feature sizes.

When fabricating the two optical elements 12, 14 on the same substrate 24, we also need to align them accurately.

Fabrication of an AFO 16 requires not only that its two lens components 12, 14 be made within their respective tolerances but also that the two components 12, 14 be aligned with the required accuracy.

An e-beam writer is preferably used to generate a zone plate 12 with a zone placement accuracy of better than 10 nm over the entire optic. We therefore expect the zone plate element 12 to perform close to the theoretical predictions.

Figure 10:
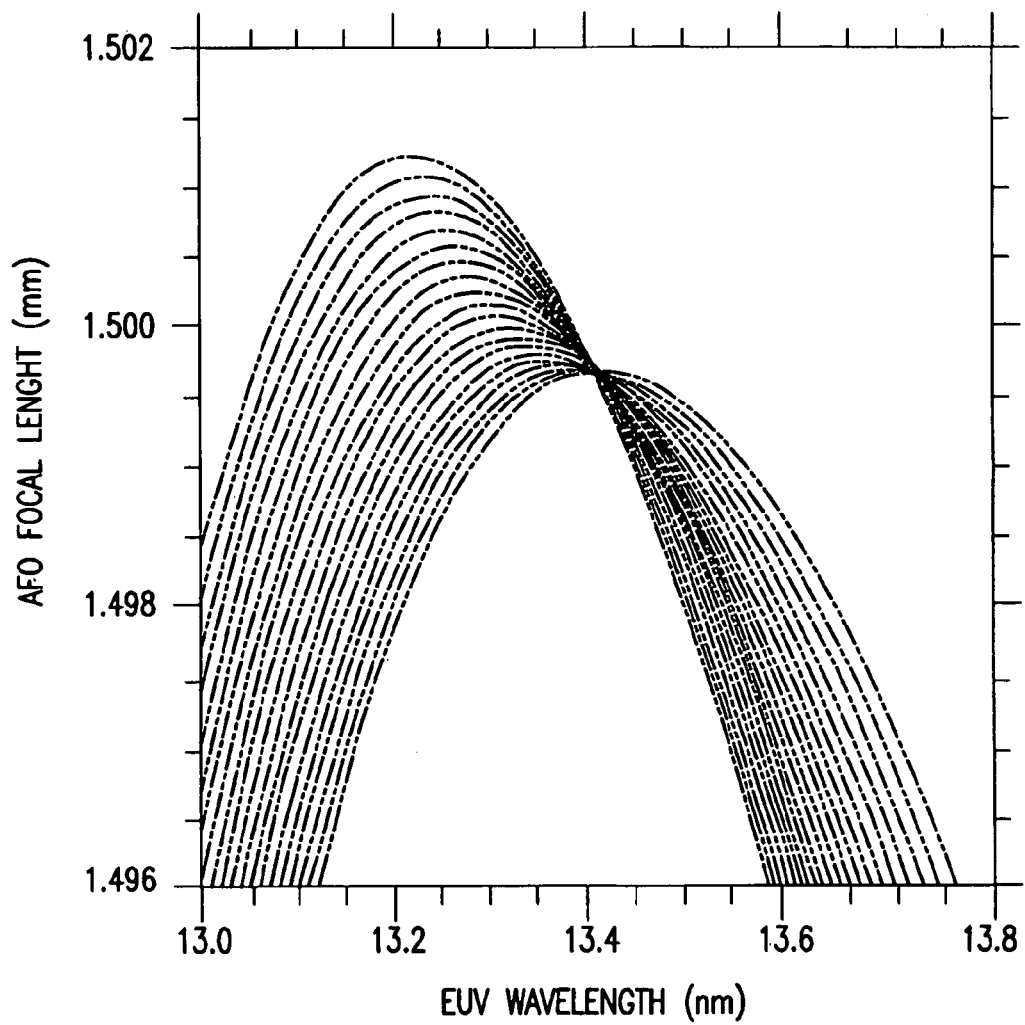
FIG. 10 is a plot of focal length (mm) as a function of wavelength (nm) showing how the focal length of the AFO varies when the radius of curvature is varied in one-micrometer increments about the designed 240 um.

The fabrication tolerance of the refractive lens 14 is characterized by the radius of curvature of an optically equivalent convex spherical refractive lens. FIG. 10 shows how the focal length of an AFO varies when the radius of curvature is varied in one-micrometer increments about the designed 240 um. It is apparent that the center wavelength of the bandwidth and the focal length of the AFO shift with a change in the radius of curvature. This effect necessitates a control of a few micrometers in the radius of curvature of the refractive lens, imposing a tolerance of about 10 nm in the refractive lens profile.

When the zone plate and the refractive lens are fabricated on the same substrate, only the lateral shift error is relevant. With the use of fabrication fiducials, for example, the alignment error can be routinely kept under 50 nm. A lateral shift error has the same effect of increasing the radius of curvature on one side of the lens and decreasing it on the opposite side. The shift on the order of 50 nm will have negligible effect on the performance of the AFO.

Figure 11:
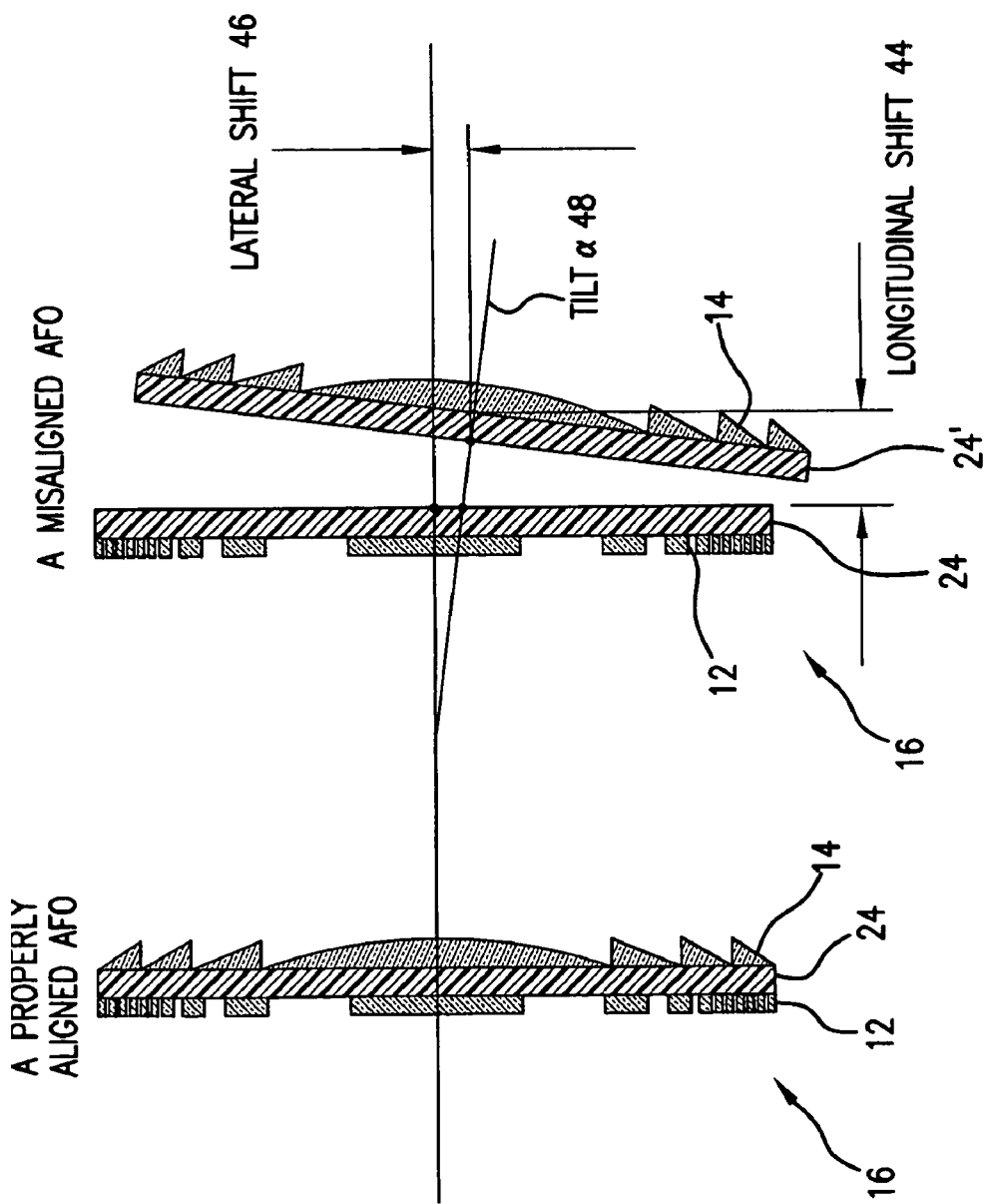
FIG. 11 is a side plan view illustrating three possible misalignments between the zone plate and the Fresnel refractive optic in the AFO.

Since both the zone plate and the Fresnel refractive optic in the AFO are axially symmetric (i.e., having cylindrical symmetry), there are three possible misalignments as shown in FIG. 11: shifts along (longitudinal) 44 and perpendicular (lateral) 46 to their aligned symmetry axis and relative tilt 48. The main effect of these misalignments is either a loss of spatial resolution or a reduction of the usable spectral bandwidth. Because the Fresnel refractive optic 14 acts as a chromatic compensator and only weakly focuses (long focal length), a fairly large longitudinal shift 44 from the designed value can be tolerated. We estimated acceptable longitudinal shifts and concluded that several micrometers of longitudinal shift are tolerable for all cases considered. The effects of the lateral shift 46 and the relative tilt 48 on the optical properties of the AFO 16 can be considered from the fact that the Fresnel refractive lens 14 is optically equivalent to a convex spherical lens. The allowable shift and tilt can be estimated from the tolerance of the radius of curvature of the equivalent spherical convex lens. Our analysis indicates that a lateral shift of 100 nanometers and a relative tilt of 0.5 milliradians are acceptable with 50 nm resolution.

Optical System

Figure 12:
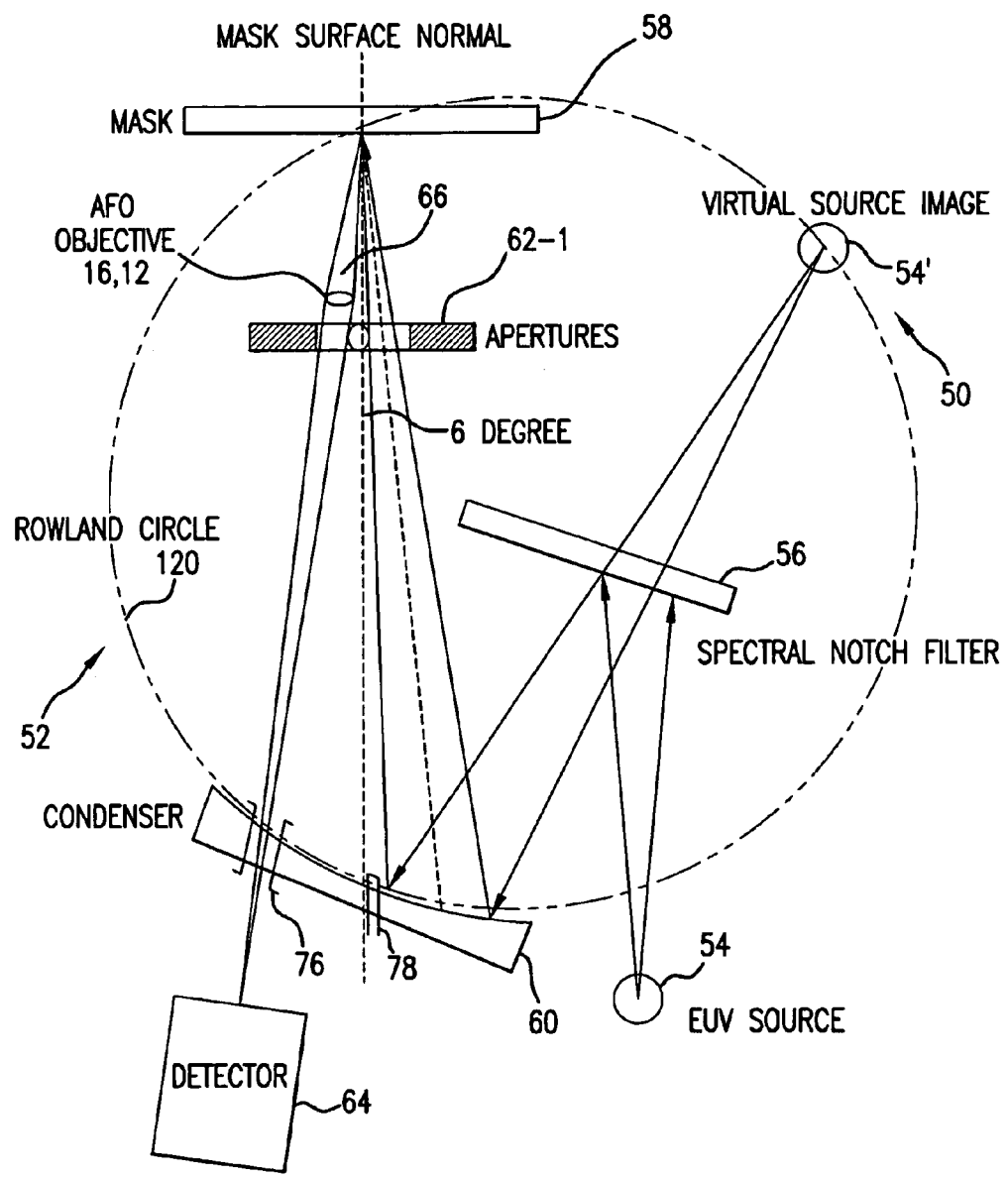
FIG. 12 is a schematic side plan view of a first embodiment of the optical system for the microscope/AIM tool with a 6° mask illumination angle.
Figure 13:
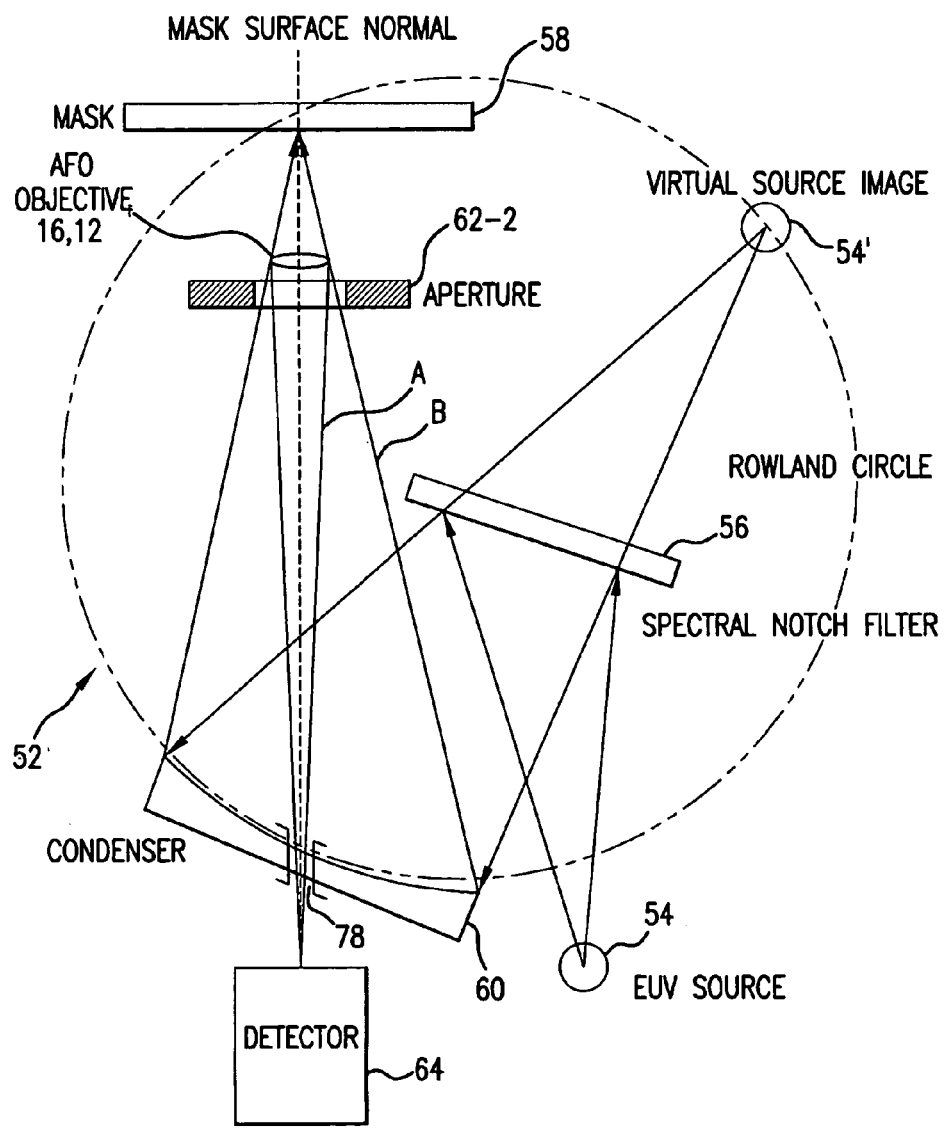
FIG. 13 is a schematic side plan view of a second embodiment of the optical system for the microscope/AIM tool with a zero mask illumination angle, i.e., normal incidence.

In some cases, the mask in the AIM microscope mode should be illuminated at 5-7 degrees off normal. One optical system design selected 6 degrees for the AIM microscope modes, but normal incidence for the AIM high-resolution microscope mode. A schematic design of a first embodiment of the optical system for the AFO-based AIM tool with a 6° mask illumination angle is shown in FIG. 12. In one implementation, the AFO 16 is used. In another implementation, the AFO 16 is replaced with a zone plate lens 12, only. Here, the spectral notch filter has a narrower spectral bandwidth. FIG. 13 shows a second embodiment for the AIM high-resolution microscope modes with a zero mask illumination angle, i.e., normal incidence.

The optical system comprises an EUV illumination system 50 and an EUV imaging system 52. The illumination system includes an EUV radiation source 54, a multilayer-coated flat spectral notch filter 56 mainly responsible for providing the required spectral bandwidths and reversing the beam propagation direction thus permitting the source to be placed opposite of and distant from the mask 58, a multilayer-coated aspherically shaped condenser 60 providing proper illumination of the mask 58 under investigation, and an aperture adjustment system 62-1 for controlling the pupil fill (partial coherence).

The EUV imaging system comprises an AFO 16 or zone plate objective 12 for imaging with sufficient magnification in a single stage and a spatially resolved detector such as a back-thinned CCD or CMOS detector 64 for recording the magnified images. The AFO objective 16 for the actinic lithography emulation (AIM) mode has a 1.5 mm working distance, and with a magnification factor of 650, the imaging system has the path length of less than 1 m. The AFO 16 for the high-resolution mode has a working distance of about 0.75 mm and magnification of 1300. Switching between the AIM and high-resolution modes is accomplished by placing a suitable AFO into the correct position and selecting an appropriate aperture size to obtain a desired illumination beam. The switching process can be performed remotely via a simple operation without removing the mask 58 being inspected. Additionally, contrast enhancement techniques including phase contrast and dark-field imaging modes are used for the high-resolution mode. Phase contrast imaging will be achieved by inserting a phase shifting ring (or disk) on top of the AFO 16 or zone plate 12 and suitably shaping the illumination beam using the aperture adjustment system 62-1. Dark-field imaging mode will be obtained by reducing the pupil fill of the illumination beam using aperture system 62-1 and placing a beam stop 66 near the AFO 16 to block the direct beam and to allow only the scattered beam to be collected and imaged by the AFO 16.

Under off-normal imaging of the mask 58, the mask features within the field of view (FOV) is not within a plane orthogonal to the optical axis (see FIG. 12). Therefore, it is possible that one part of the mask within the FOV is being imaged in focus while the other part is out of focus. Furthermore, the image magnification could also vary over the FOV and result in image distortion. Whether or not the off-normal imaging is acceptable depends on the relative size of the depth of focus (DOF) of the imaging system and the distance between the two edges of the FOV in the scattering plane. When the former is larger than the latter, all the features within the FOV can be imaged simultaneously with acceptable image quality.

The DOF of the imaging system 52 is equal to $DOF=\lambda/NA^2$. The distance between the two edges of the FOV within the scattering plane is proportional to the FOV and sine of the off-normal illumination angle $\theta$, and is equal to $FOV*\sin\theta$. This distance has been calculated by using the FOV and the numerical apertures listed in Table 4, which also includes calculated DOF values for various AIM microscope modes. The fifth row lists values of $FOV*\sin\theta$ calculated assuming $\theta=6$ degrees for the 45 nm and 32 nm AIM emulation modes and $\sin\theta=NA$ for the high-resolution microscope modes. Using the values in the fifth row, the maximum variation in the image magnification of the two edges within the FOV is calculated by dividing the $FOV*\sin\theta$ by the distance between the mask and the AFO, which approximately equal to 1.5 mm for the AIM microscope mode and 0.75 mm for the high-resolution microscope mode. The calculated relative image magnification variation is listed in the last row of the table.

The results in Table 4 shows that 6-degree off-normal illumination at the mask should not introduce significant image degradation for the AIM emulation mode for supporting the 45 nm and 32 nm lithography nodes. The image magnification variation is sufficiently small for the four cases considered. However, the DOFs for both the high-resolution microscope cases are smaller than $FOV*\sin\theta$ and, therefore, a suitable solution has to be found.

TABLE 4

Important parameters for off-normal illumination at mask

| Imaging Mode | AIM | | High-Resolution | |
|---|---|---|---|---|
| | 45 nm Node | 32 nm Node | 45 nm Node | 32 nm Node |
| NA Required | 0.0625 | 0.0875 | 0.21* | 0.27* |
| Resolution Required (nm) | 108 | 76.6 | 32 | 25 |
| DOF (μm) | 3.5 | 1.8 | 0.3 | 0.2 |
| FOV*sinθ(μm) | 1.8 | 1.3 | 1.6 | 2.0 |
| Maximum Relative Variation in Image Magnification (%) | 0.12 | 0.09 | 0.21 | 0.27 |

After considering various design options, we decided to use an optical design solution where in both the illumination and the imaging beams are along the surface normal of the mask and are collinear, schematically shown in FIG. 13, in which similar component use similar reference numerals. This design uses essentially the same optical components of the illumination system for the AIM microscope mode except that a larger area of the condenser 60 is illuminated to achieve the required large numerical the aperture. Using this design, however, one must solve the beam interference problem because the objective is directly in the path of the illumination beam.

Figure 14:
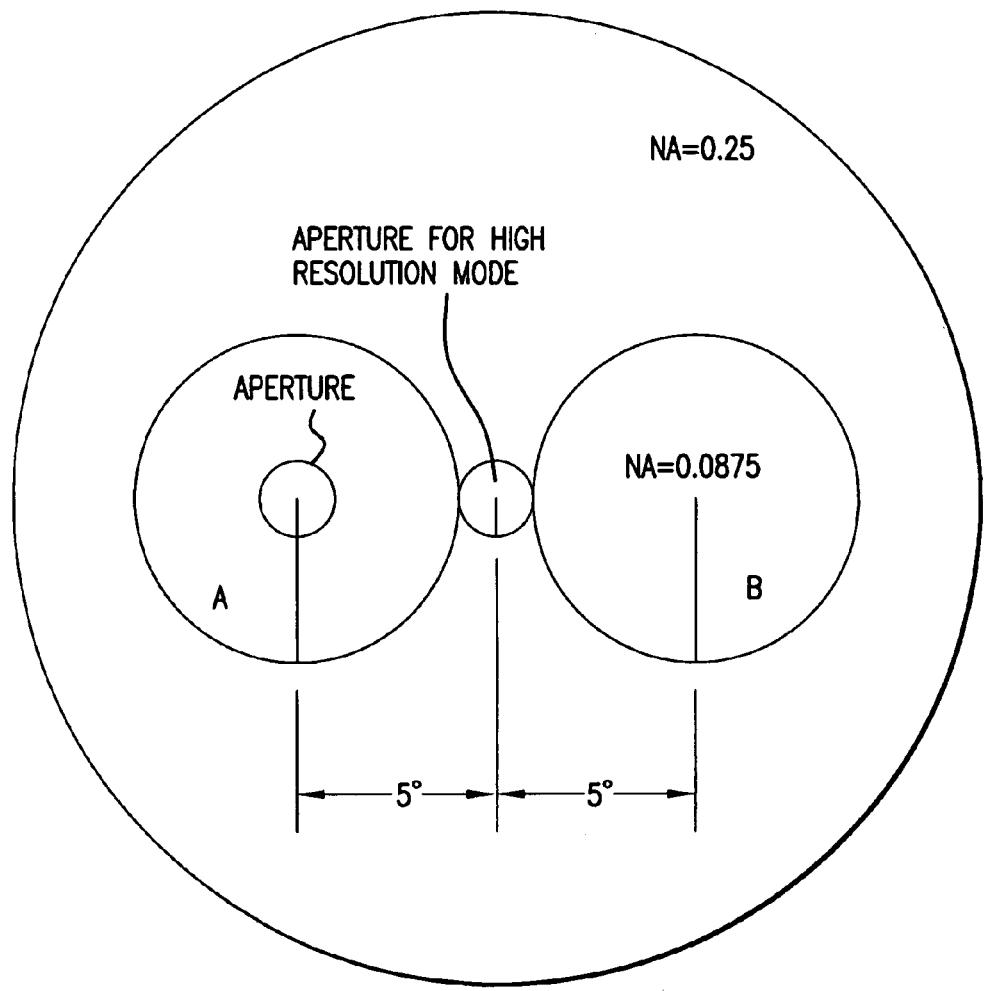
FIG. 14 schematically illustrates a solution for the AIM high-resolution microscope mode operating at a normal incidence illumination in which the imaging beam (A) and its corresponding illumination beam (B) are located on symmetrically opposite sides of the pupil axis.

The solution is based on the fact that an imaging beam and its corresponding illumination beam are located at symmetrically opposite sides of the pupil axis and they do not overlap, as schematically illustrated in FIG. 14, which is a schematic illustration of a solution for the AIM high-resolution microscope mode operating at a normal incidence illumination by using the fact that an imaging beam (A) and its corresponding illumination beam (B) are located on symmetrically opposite sides of the pupil axis and they do not overlap.

If the area of the objective corresponding to the illumination beam is made by choice to be a simple opening, then the illumination beam B is not obstructed by the objective. The beam reflected by the mask 58 will then be incident on a functional area on the objective located at the opposite and symmetric side of the illumination beam and thus imaged by the objective.

Figure 15:
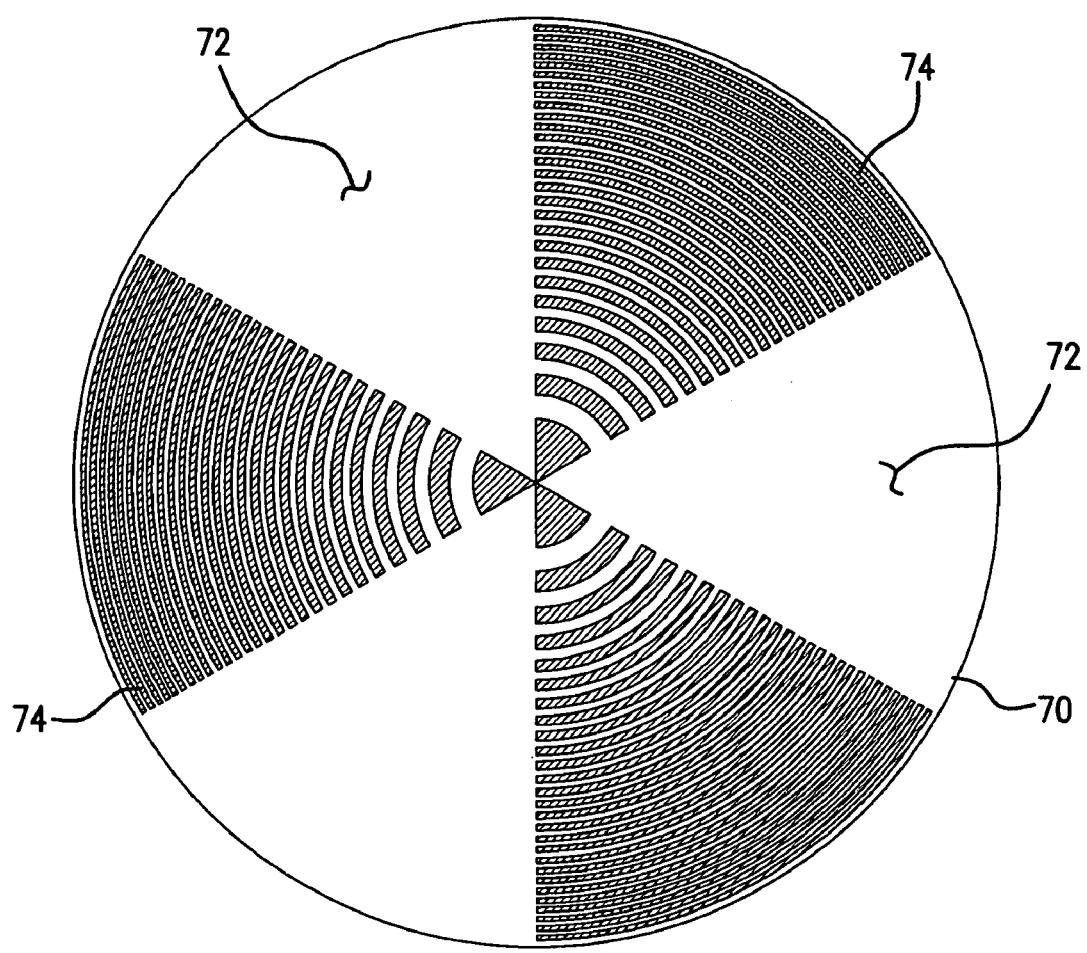
FIG. 15 shows the interrupted zone pattern of the zone plate used in the second embodiment optical system with normal incidence illumination.

The practical implementation is shown in FIG. 15, assuming that the pupil apertures of the condenser and the AFO objective are equal and they are represented in FIG. 15 by the large circle 70.

Specifically, this is a schematic illustration of the zone plate component 12 of the AFO needed for the implementation of AIM high-resolution microscope mode using normal incidence illumination. The illumination beam passes through the white sections 72 (open areas on the AFO) is reflected by the mask 58 and then imaged by the functional areas 74 of the AFO. The refractive element of the AFO does not require a similar patterning since it has no net focusing effect. Further, if a zone plate 12 is used in place of the AFO 16, then the interrupted zone pattern of FIG. 15 is also used.

Further, the illumination pupil is partitioned into sections as shown in FIG. 15 and every other section is blocked using suitably designed stops. The areas on the AFO corresponding to the unblocked illumination beams are open by design and thus does not obstruct the illumination beam. After reflection by the mask, the illumination beams are collected and imaged by the functional areas of the AFO objective. The image degradation due to the partial pupil fill may be negligible and acceptable for the AIM high-resolution microscope application. A throughput loss of about 50% is expected.

The optical system design has the following advantages. First, it will readily meet or exceed many requirements. Second, the optical train is relatively simple.

Many commercial vendors are developing EUV sources for EUV stepper/scanners. While these sources will have a target in-band power of about 100 Watts (W), a source with a modest output of 1 Watt (W) will be sufficient for the AIM tool. These sources are already available from a number of manufacturers, such as Cymer and Plex. A source with 1 W in-band power, 1×1 mm size, and 4π emission solid angle has approximately $10^{17}$ photons/(second mm$^2$ str) brightness. Since the imaging field is only 20×20 μm, the power level of the source can be drastically reduced if the source size can be decreased to a comparable level. Innolite for example, can reduce the source size to about 50×50 μm with more than 20 mill-Watts (mW) power. The brightness of this source is equivalent to the 1 W source discussed above. It is sufficient for the AIM tool application, and also provides many additional desirable characteristics such as low power consumption, and less debris.

Preferably the source 54 is a either a laser-plasma source or a gas discharge source. A copper target is used in some implementations.

In the illustrated designs, a virtual source 54' of the extreme ultraviolet radiation source 54 formed by the condenser 60 and the region of interest of the mask 58 resides on a Rowland circle 120 determined by the condenser 60.

In practice, all EUV sources produce debris during operation and the AIM tool must shield the mask from their contamination. We plan to remove most of the debris first by a series of differentially pumped sections at the source. Because of the high efficiency of the AFO-based optical train, there is enough throughput budget to introduce a debris filter at the source to prevent the contaminant from exiting the source. The last stage of contamination prevention is provided by the AFO objective itself. As a transmissive optic fabricated on a thin membrane, it can act as a barrier that hermetically separates the reticle handling system from the rest of the imaging system. Contamination will be monitored at both the reticle section and the optics section. The optics section will be constantly kept in a vacuum environment, so that particle monitoring is not important. We will therefore use a residual gas analyzer to monitor the out-gassing. The reticle section is connected to the airlock, and both organic contaminant and small particles need to be monitored. The organic contaminants will be monitored by a residual gas analyzer, and a laser particle counter will monitor particles every time the airlock is in operation.

The AIM tool requires that the illumination beam have a spectral bandwidth closely matching that of the scanner/stepper used in manufacturing, especially for the AIM mode. Our optical system design achieves the required spectral bandwidth using a combination of the reflective spectral notch filter 56 and the condenser 60. The spectral notch filter 56 and the condenser 60 are both multilayer-coated optics and the product of their reflectivity determines the spectral bandwidth of the illumination beam.

Figure 16A:
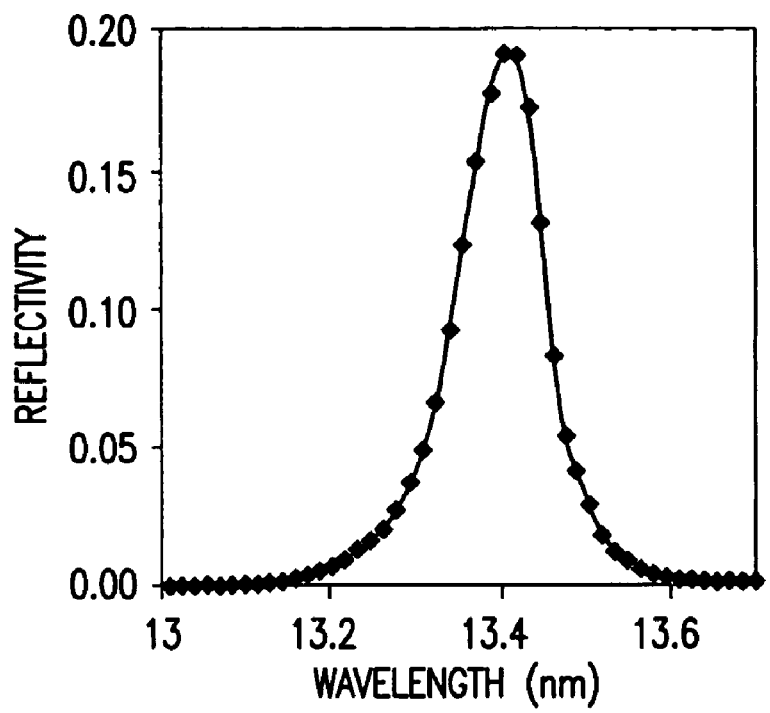
FIGS. 16A and 16B are plots of the combined reflectivity of the spectral notch filter and condenser as a function of wavelength (nm) for an embodiment using a zone plate objective and an AFO objective, respectively.
Figure 16B:
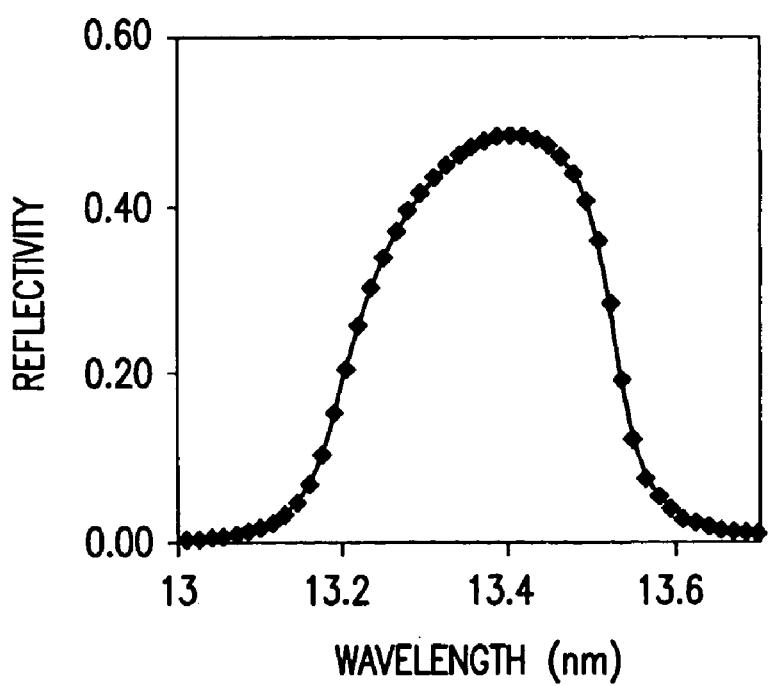

The spectral notch filter 56 is a flat multilayer mirror while the condenser 60 is an aspherical multilayer mirror. It is therefore desirable to use the well-established Mo/Si multilayer technology to coat the condenser. Using 0.2 as the fractional Mo layer thickness, defined as the ratio of the Mo layer to the multilayer period, for both the condenser 60 and the spectral notch filter 56, we computed a FWHM spectral bandwidth of ~2%. FIG. 16B shows the calculated combined reflectivity.

The multilayer period of the spectral notch filter 56 needs to be graded because of the variation of incidence angle over the notch filter, especially for the high-resolution mode. The spectral notch filter is cooled in some embodiment to maintain the optical system alignment and to prevent multilayer spacing from changing.

In implementations in which a zone plate lens is used, instead of an AFO lens, as the objective, a narrower spectral bandwidth is required. The required spectral bandwidth is achieved in our design using a spectral notch filter with the following multilayer parameters: Si/Sc multilayer, 6.76 nm period, 100 layer pairs, and 0.13 fractional Sc layer thickness. FIG. 16A shows the calculated combined reflectivity of a condenser and a spectral notch filter assuming an 84-degree incidence angle for both optics.

The same condenser is assumed in calculating both FIGS. 16A and 16B and its multilayer parameters are: Si/Mo multilayer, 6.815-nm period, 100 layer pairs, 0.2 fractional Mo layer thickness.

The multilayer parameters of the spectral notch filter for FIG. 16B are the same as that for the condenser. For FIG. 16A they are: Si/Sc multilayer, 6.76-nm period, 100 layer pairs, and 0.13 fractional Sc layer thickness.

An important advantage of the combination of a spectral notch filter and a condenser is that the spectral notch filter 56 is the only optical component in the direct flight path of the radiation from the source 54 and it is relatively easy and cheap to fabricate and replace. It will protect the more expensive condenser 60, which does not directly "see" EUV source 54 and reduce or even avoid the need of actively cooling the condenser 60. We expect that this advantage may have substantial positive cost benefits associated with the proposed AIM tool.

The condenser 60 is designed to achieve the following three functions in the AIM tool: (1) focus the illumination beam onto the mask 58 with an adequate numerical aperture and provide, in conjunction with the aperture adjustment system, an appropriate partial coherence for a specific AIM mode or a high-resolution mode, (2) provide the illumination beam, in conjunction with the spectral notch filter 56, with the desired bandwidth for the alpha and beta tools, and (3) illuminate the mask over the required field of view with an illumination uniformity better than +/−2%.

The condenser is preferably an aspherical multilayer mirror with the multilayer period suitably graded across the condenser. When fully illuminated, the reflected beam from the condenser has a maximum numerical aperture of 0.25, sufficient for achieving 30-nm resolution. For the 45 nm and 32 nm nodes in the AIM emulation mode, an illumination beam reflected by one part of the condenser is used to illuminate the mask (see FIG. 12). The incidence angle of the central ray of this beam on the mask is set to 6 degrees but can be set to a different value. For the AIM high-resolution mode, an incidence angle of the central ray on the mask is set to zero to achieve the normal incidence illumination condition (see FIG. 13). The condenser has two small openings 76, 78 to allow the passage of the imaging beams in the AIM and high-resolution modes, respectively.

Figure 17:
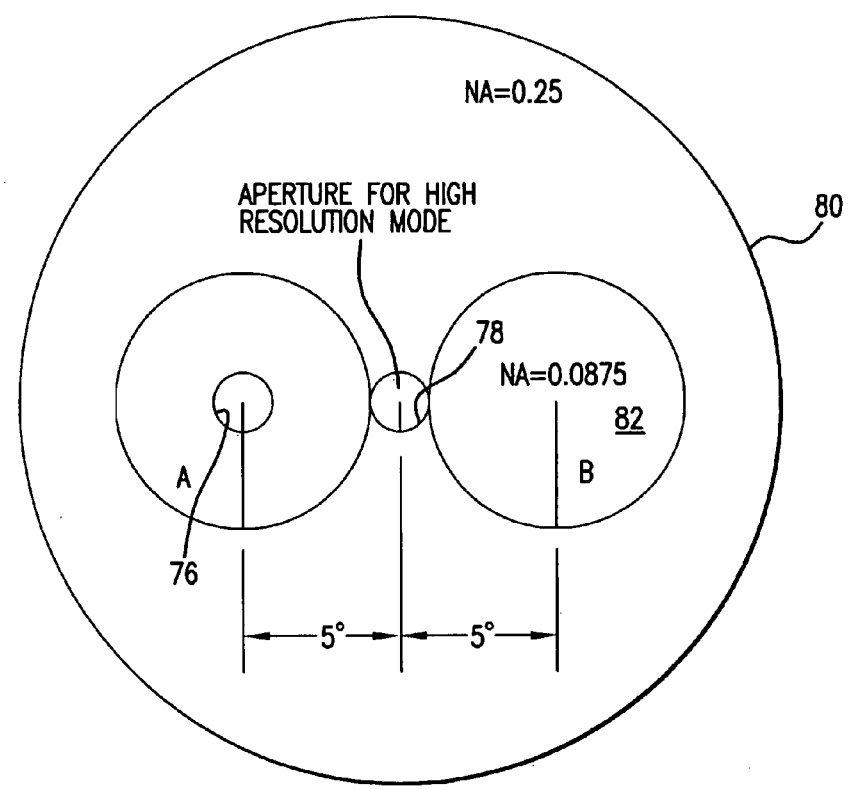
FIG. 17 shows schematically the sizes and relative positions of the pupils.

FIG. 17 shows schematically the sizes and relative positions of the illumination beam pupil on the condenser for the AIM high-resolution mode (the large circle 80, NA=0.25), the pupil for the AIM 32 nm node 82 (NA=0.0875), and the missing pupil parts corresponding to the openings 76, 78 on the condenser 60 that allow passage of the imaging beams to the detector.

The desired partial coherence is achieved by selecting and inserting the appropriate aperture 62 into the illumination beam. Using the aperture adjustment system and a set of apertures of suitable shapes and sizes, the desired partial coherence can be changed from the Kohler illumination condition to a smaller value determined by the AIM operators.

The use of the same condenser 60 for the AIM and high-resolution modes requires that the reflectivity over the angular range corresponding to the designed maximum numerical aperture 0.25 to be fairly constant. Using the same multilayer parameters for the condenser.

Figure 18:
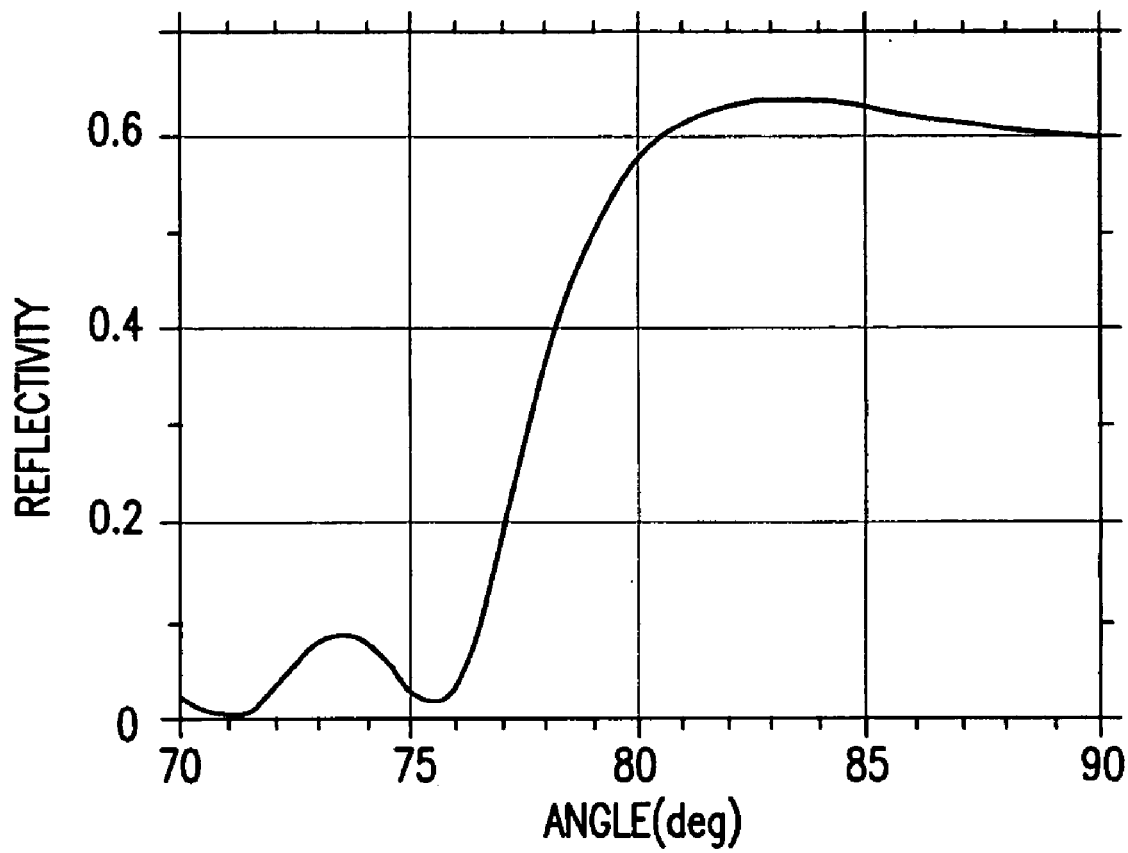
FIG. 18 is a plot of reflectivity as a function of angle in degrees for the condenser for the AIM and high-resolution modes.

The reflectivity as a function of angle was calculated and shown in FIG. 18, which is the calculated reflectivity for a multilayer with the same parameters as the condenser. Note that the reflectivity remains flat over a large angular range. The fairly flat reflectivity over 10 degrees indicates that the same condenser could indeed be used for both the AIM and high-resolution modes.

The surface figure and the multilayer coating quality of the condenser determine the intensity distribution of the illumination beam over the field of view.

The parameters of the zone plate objective 12, when used instead of the AFO 16, are designed to have a spatial resolution to meet an AIM 45 nm microscope requirement. This zone plate is comparable to the AFO designed for the AIM mode in most performance categories, such as resolution and field of view, and with about twice the throughput. Its focal length is approximately one third of the AFOs designed for the AIM mode and its bandwidth is about 0.7%. The resulting short focal length and narrow bandwidth is a result of uncorrected chromatic aberration of the zone plate 12, and this zone plate design is a compromise taking into account of the optical designs (e.g. the spectral filter) and the mechanical system (e.g. objective proximity to the mask, and increased magnification).

The following table sets forth the specifications for the zone plate 12 when the AFO is not used:

| | |
|---|---|
| Smallest zone width | 108 nm |
| Number of zones | 140 |
| Wavelength | 13.4 nm |
| Diameter | 60.5 um |
| Focal length | 0.487 mm |
| Material | Mo |
| Zone thickness | 75 nm |

The following table sets forth the specifications for the AFO 16 when the AFO is used instead of the zone plate 12:

The AFO for the AIM Mode for 45 nm Node Size

TABLE 5

Specification of the AFO designed for the AIM mode for 45 nm node size.

| Zone plate | |
|---|---|
| Diameter | 186 um |
| Outer zone width | 108 nm |
| Numerical aperture | 0.0625 |

TABLE 5-continued

Specification of the AFO designed for the AIM mode for 45 nm node size.

| | |
|---|---|
| Focal length | 1.5 mm |
| Depth of field | 3.5 um |
| Number of zones | 431 |
| Efficiency | 55% |
| Refractive lens | |
| Diameter | 186 um |
| Radius of curvature | 121 um |
| Number of segments | 87 |
| Outer segment width | 420 nm |
| Efficiency | 60% |
| Combined AFO | |
| Resolution ($\lambda$/2NA) | 108 nm |
| Focal length | 1.5 mm |
| Achromatic bandwidth | 0.6 nm |
| Substrate throughput | 85% |
| Efficiency | 25% |

Figure 19:
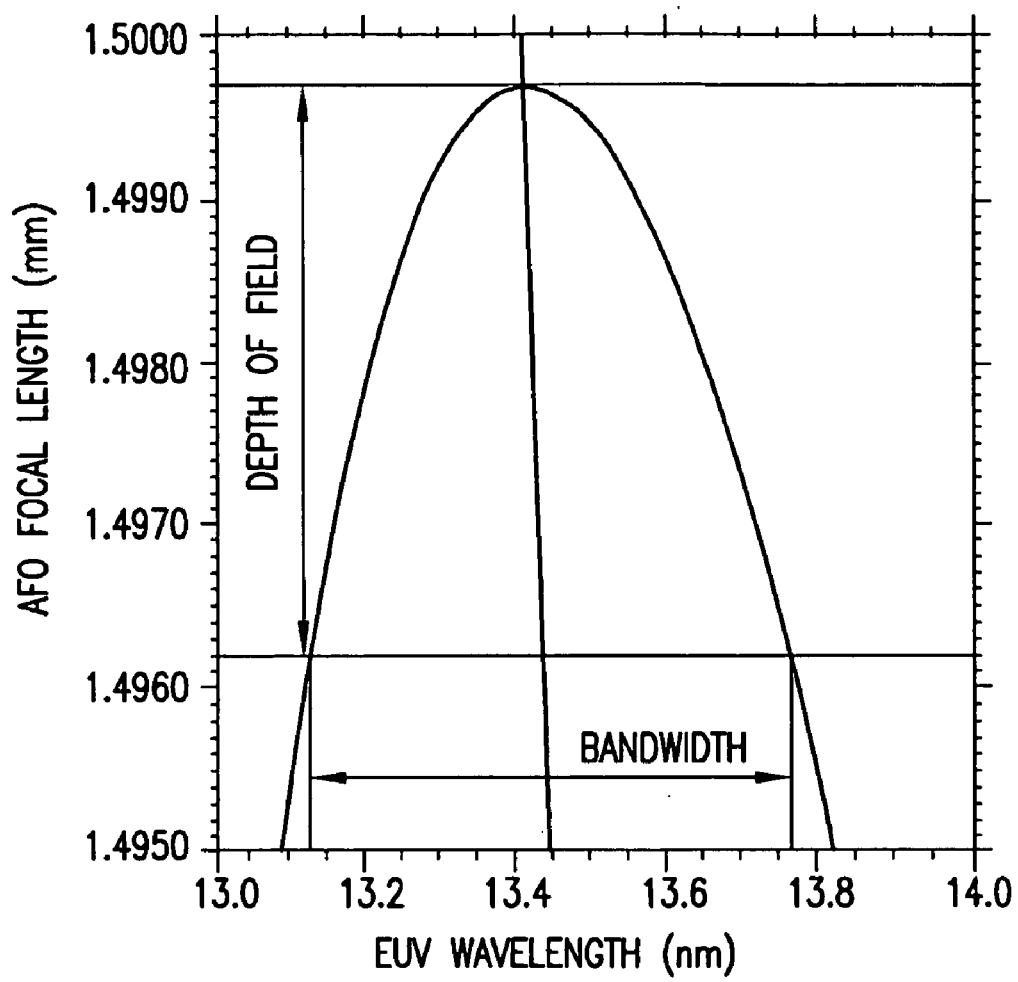
FIG. 19 is a plot of the focal length (mm) of the AFO as a function of wavelength (nm)
Figure 20:
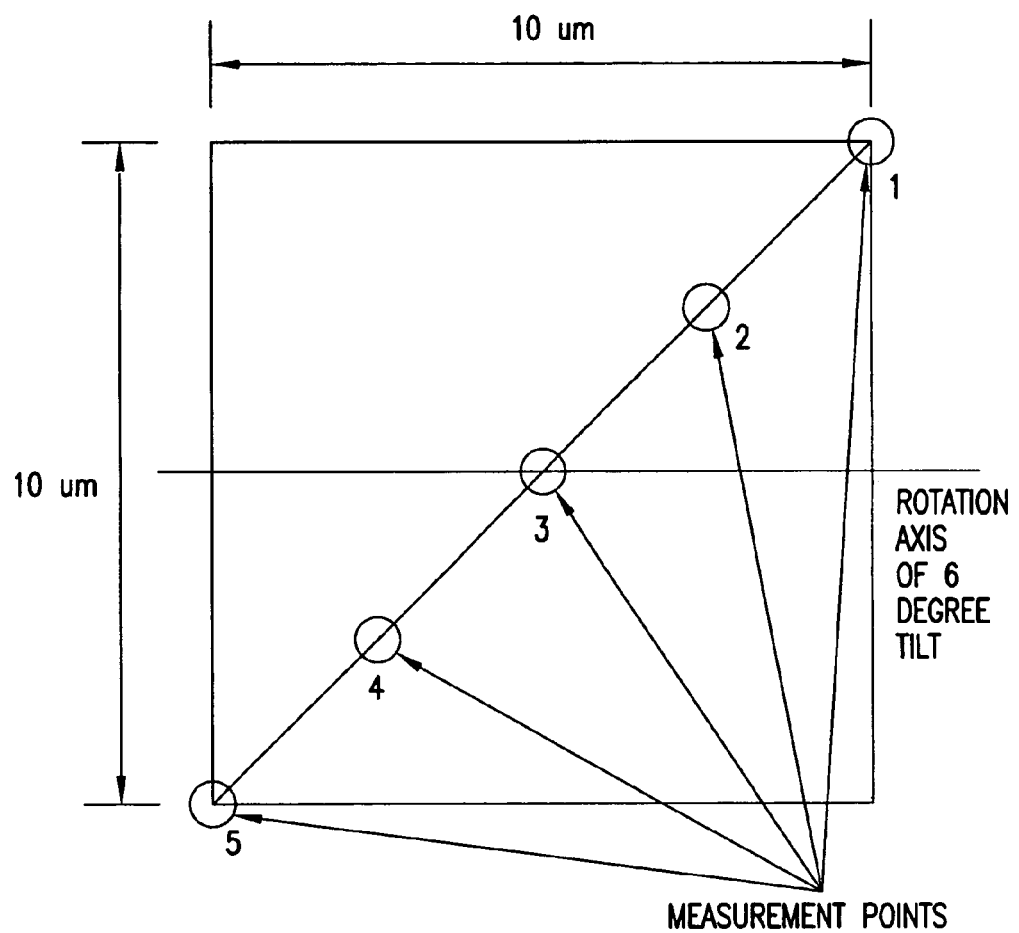
FIG. 20 is shows the wavefront error and the aberrations measured at 5 points across the imaging field, the center, two diagonal corners, and two points half way between the center the corners.
Figure 21:
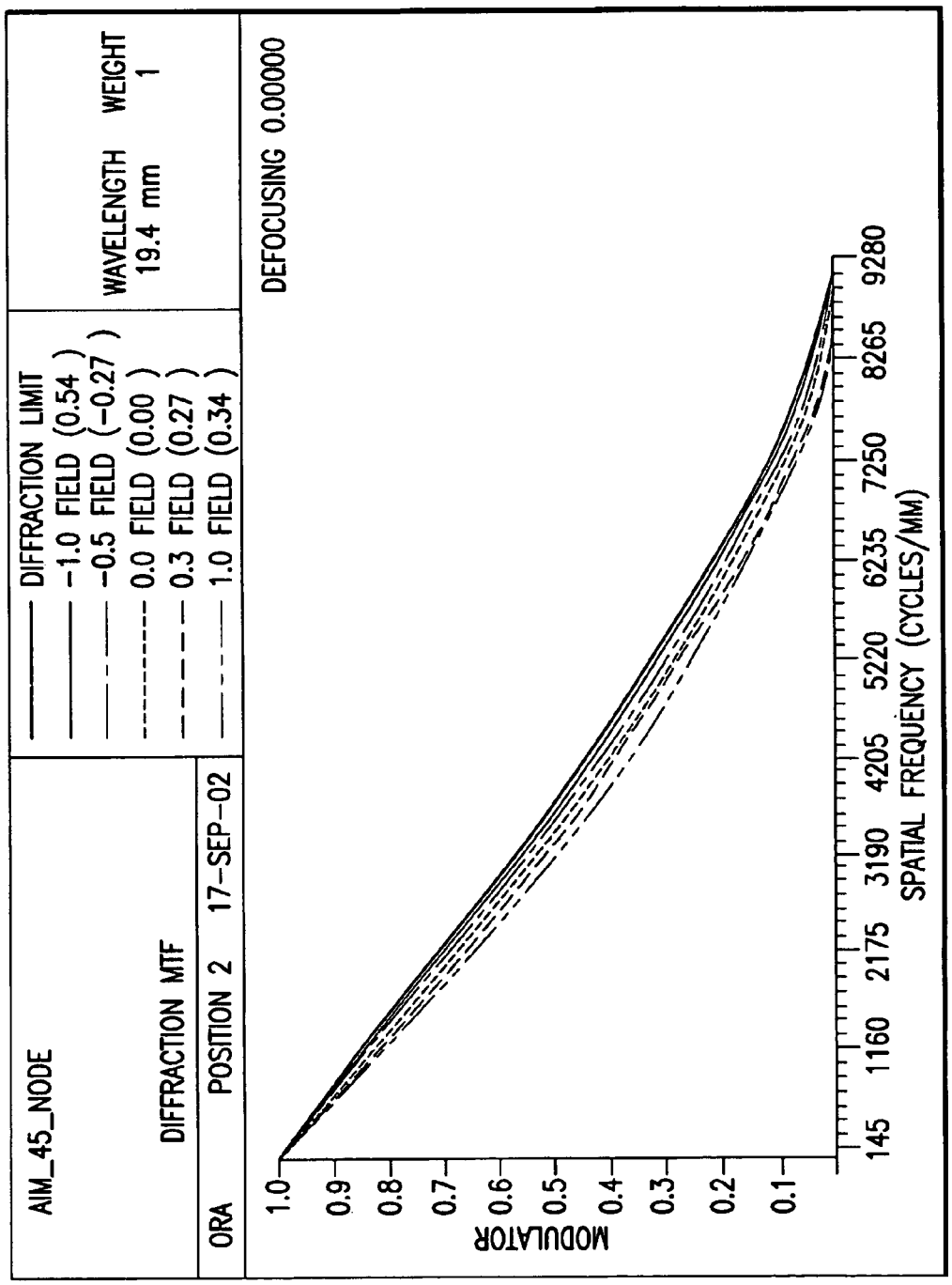
FIG. 21 is the modulation transfer function (MTF) curve for the measurement positions shown in FIG. 20.

The specifications for the AFO 16 designed for the AIM mode with 45 nm node is shown in Table 5. The optic 16 comprised a zone plate 12 with 186 μm diameter and 108 nm outer most zone width, and a refractive lens 14 with the same diameter to compensate for the dispersion. The zone plate 12 of the AFO 16 has 431 zones, and would have a bandwidth of about 0.5% (0.06 nm) without the chromatic correction element. When combined with the refractive element 14, the resulting lens 16 has a numerical aperture of 0.0625 with 108 nm resolution and 0.6 nm bandwidth. The focal length of this AFO is plotted as a function of wavelength in FIG. 19. The monochromatic aberrations of this lens were also analyzed with CODE V optical design software. Due to software limitations, we only analyzed the properties of the zone plate. This approximation can be justified because the refractive lens has no net focusing effect near 13.4 nm, where the index of refraction of silicon is 1, but only acts as a dispersion compensation element. In fact its focal length is infinity at 13.4 nm and ranges to many meters for other wavelengths within its bandwidth. This is 3 to 4 orders of magnitudes larger than that of the zone plate. It follows that the refractive lens 14, while compensating the chromatic aberration of the zone plate 12, makes negligible contribution to the monochromatic aberrations. The wavefront error and the aberrations are measured at 5 points across the imaging field, as indicated in FIG. 20: the center, two diagonal corners, and two points half way between the center the corners. The imaging field is tilted by 6 degrees along a normal axis, leading to an equivalent of approximately 4.25 degree tilt along the diagonal. The wavefront errors of the AFO for the 45 nm node are shown in Table 6 and its primary monochromatic aberrations are shown in Table 7. The modulation transfer function (MTF) curve for the measurement positions are shown in FIG. 21.

It is well known that the distortion term is zero for Fresnel zone plates. This AFO 16 exhibits excellent characteristics for high-resolution imaging in both resolution and contrast. It satisfies the specification for the AIM without any monochromatic aberration corrections. The performance, however, can be significantly improved by correcting its primary aberrations. It is clear from Table 7 that spherical aberration and coma are the dominate aberrations. Aberration correction methods that effectively eliminate both spherical aberration and coma were described above. For this lens, the zone placement can be adjusted to produce an aspherical zone plate and the telecentric stop placed at the back focal plane practically reduces coma to a negligible level. With these corrections, we believe that the wavefront error can be reduced to less than 5 m$\lambda$. The two elements will be produced on the opposite sides of a single 100 nm thick $Si_3N_4$ membrane substrate 24 as illustrated in FIG. 8.

TABLE 6

Wavefront errors of the AFO for AIM mode at 45 nm node without aberration correction.

| | Best Individual Focus | | | | Best Composite Focus | | | |
|---|---|---|---|---|---|---|---|---|
| Pos. | Shift (um) | Focus (um) | RMS waves | STREHL | Shift (um) | Focus (mm) | RMS waves | STREHL |
| 1 | 0.000 0.074 | −1.170 | 0.0157 | 0.990 | 0.000 −0.019 | −0.059 | 0.0496 | 0.908 |
| 2 | 0.000 0.029 | −0.546 | 0.0076 | 0.998 | 0.000 −0.009 | −0.059 | 0.0219 | 0.981 |
| 3 | 0.000 −0.005 | 0.010 | 0.0001 | 1.000 | 0.000 0.000 | −0.059 | 0.0029 | 1.000 |
| 4 | 0.000 −0.033 | 0.500 | 0.0076 | 0.998 | 0.000 0.009 | −0.059 | 0.0248 | 0.976 |
| 5 | 0.000 −0.045 | 0.925 | 0.0156 | 0.990 | 0.000 0.018 | −0.059 | 0.0443 | 0.926 |

COMPOSITE RMS = 0.03322 waves

TABLE 7

Primary aberrations of the AFO for AIM mode without aberration correction. All units are in micrometers, except for PTZ, which is in degrees.

| SA | TCO | TAS | SAS | PTB | DST | AX | LAT | PTZ |
|---|---|---|---|---|---|---|---|---|
| −0.052 | 0.029 | −0.008 | −0.002 | 0.001 | 0.000 | 0.000 | 0.000 | 0.296296 |

Figure 22:
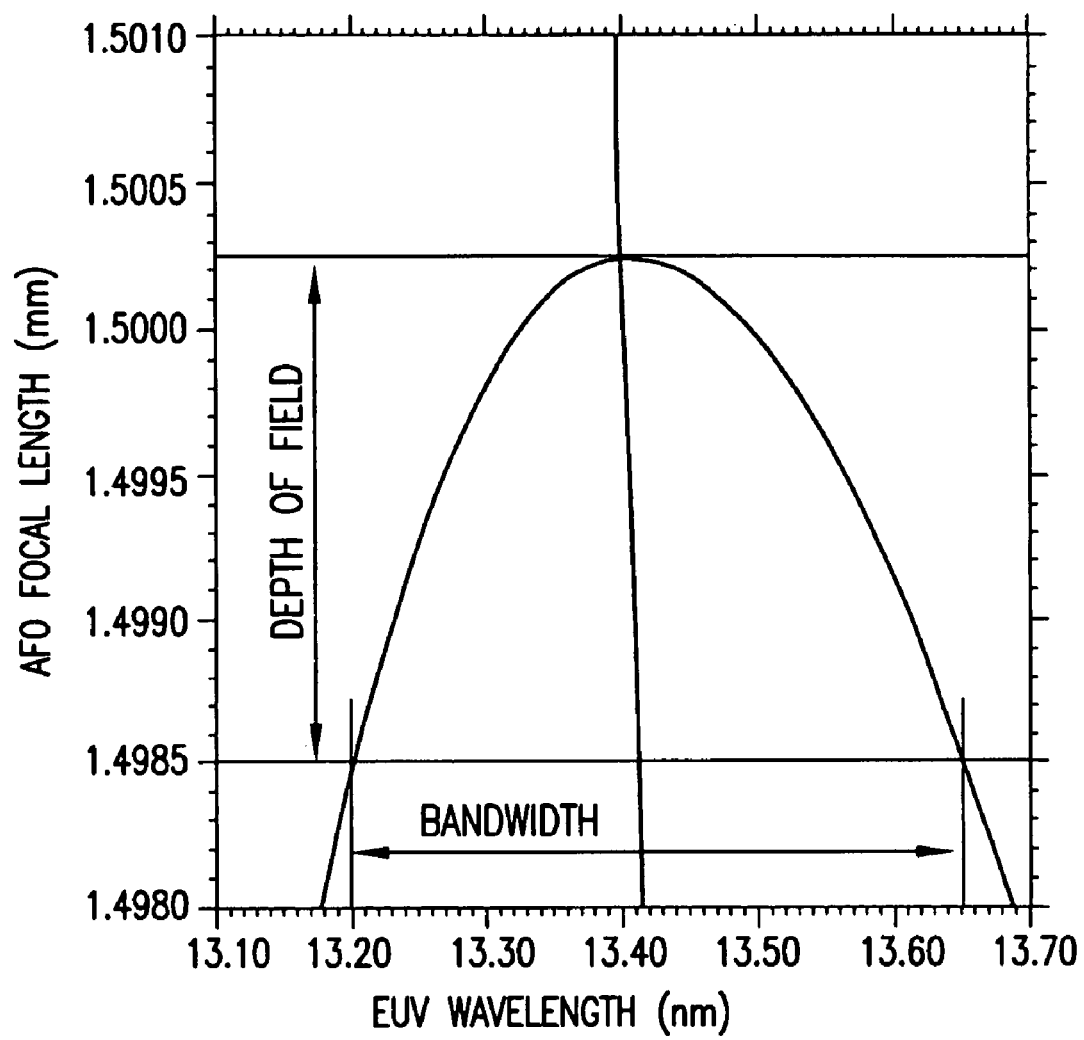
FIG. 22 is a plot of the focal length of the AFO for the AIM mode with 32 nm node size as a function of the wavelength (nm)

The specifications for the AFO designed for the AIM mode with 32 nm node size is shown in Table 8. This lens has a zone plate with 262.5 um diameter and 76.7 nm outer most zone width, and a refractive lens with the same diameter to compensate for the dispersion. The zone plate has 857 zones, and would have a bandwidth of about 0.25% (0.03 nm) without the chromatic correction element, as shown in FIG. 22, in which the focal length of the AFO for the AIM mode with 32 nm node size as a function of the focal length, the depth of field of this lens is about 1.8 um and the bandwidth is bout 0.45 nm, or 3.3%.

TABLE 8

Specification of the AFO for the AIM mode with 32 nm node size.

| Zone plate | |
|---|---|
| Diameter | 262.5 um |
| Outer zone width | 76.6 nm |
| Numerical aperture | 0.0875 |
| Focal length | 1.5 mm |
| Depth of field | 1.8 um |
| Number of zones | 857 |
| Efficiency | 50% |
| Refractive lens (doublet) | |
| Diameter | 262.5 um |
| Radius of curvature | 242 um |
| Number of segments | 155 |
| Outer segment width | 390 nm |
| Efficiency | 60% |
| Combined AFO | |
| Resolution ($\lambda/2NA$) | 76.6 nm |
| Focal length | 1.5 mm |
| bandwidth | 0.45 nm |
| Substrate throughput | 60% |
| Efficiency | 18% |

When combined with the refractive element, the resulting lens has a numerical aperture of 0.0875 with 76.7 nm resolution and 0.45 nm bandwidth. At this higher numerical aperture, these aberration correction schemes will become necessary as the wavefront error will exceed $\lambda/25$. Again, spherical aberration and coma dominate, and as in the case of AFO for 45 nm node, with the same aberration correction methods described in section 2.3.5, the wavefront error can be kept below 5 m$\lambda$.

An important practical difference between this lens and the one for the 45 nm node size is that a single refractive element is not able to produce enough dispersion compensation for the zone plate and consequently, a refractive doublet will be required. The extra element requires an additional substrate which contributes to absorptive loss. The combined throughput of this lens is about 21%. On solution is to fabricate the two refractive lenses on a single substrate and fabricate the zone plate on a separate substrate. The two elements will then be mounted in close proximity, resulting in a 3-element in two group construction. Besides the requirement of the additional element, the fabrication requirement of this AFO is similar to the one designed for the 45 nm node size.

Figure 23:
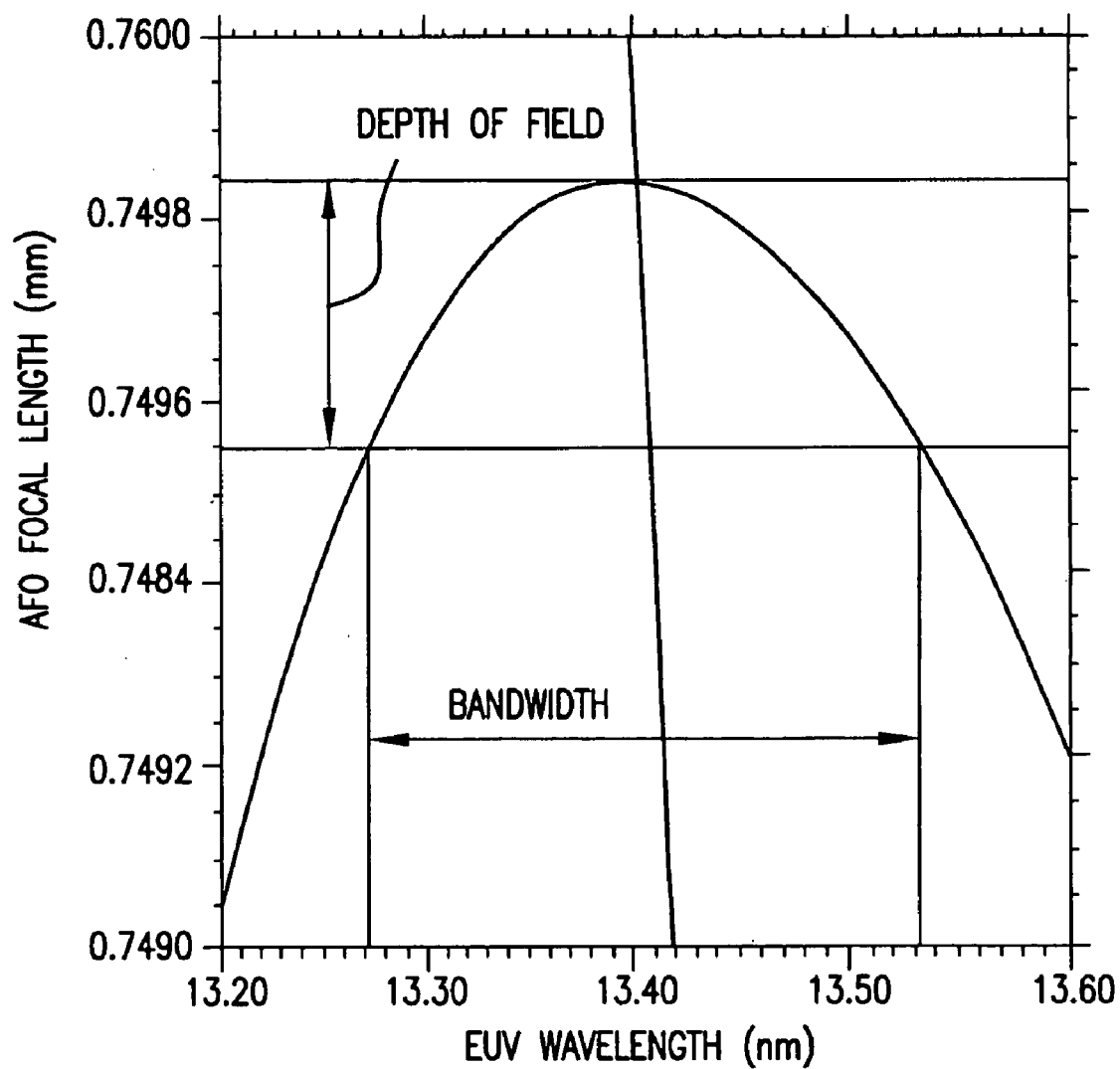
FIG. 23 is a plot of the focal length of the AFO for high-resolution mode as a function of the wavelength (nm)

An AFO designed for the high-resolution mode is shown in Table 9. The optic has of a zone plate with 335 um diameter and 30 nm outer most zone width, and a refractive lens with the same diameter to compensate for the dispersion. The zone plate has about 2800 zones, and would have a bandwidth of about 0.07% (0.01 nm) without the chromatic correction element. When combined with the refractive element, the resulting lens has a numerical aperture of 0.223 with 30 nm resolution and 0.25 nm, or about 2%, bandwidth. The focal length of this AFO 16 is plotted as a function of wavelength in FIG. 23, in which the depth of field of this lens is about 0.3 um and the bandwidth is about 0.25 nm. The wavefront error and aberrations have been calculated at five points across the imaging field similar to the ones described in for the AFO for the AIM mode. As in the case for the AIM mode, the spherical aberration and coma dominate the aberrations and must be corrected to obtain acceptable image quality. We expect to be able to eliminate the spherical aberration and drastically reduce the coma by the correction methods described above and keep the wavefront error to less than 20 m$\lambda$.

TABLE 9

Specification of the AFO for the high-resolution mode.

| Zone plate | |
|---|---|
| Diameter | 335 um |
| Outer zone width | 30 nm |
| Numerical aperture | 0.223 |
| Focal length | 0.75 mm |
| Depth of field | 0.3 um |
| Number of zones | 2792 |
| Efficiency | 50% |
| Refractive lens (triplet) | |
| Diameter | 335 um |
| Radius of curvature | 183 um |
| Number of segments | 219 |
| Outer segment width | 221 nm |
| Efficiency | 20% |
| Combined AFO | |
| Resolution ($\lambda/2NA$) | 30 nm |
| Focal length | 0.75 mm |
| Achromatic bandwidth | 0.25 nm |
| Substrate throughput | 70% |
| Segmentation loss | 50% |
| Efficiency | 3.5% |

At this numerical aperture, three refractive lenses will be required to compensate for the zone plate dispersion. We plan to fabrication one refractive lens on the same substrate as the zone plate and the other two on the same substrate. The resulting AFO will have about 3.5% efficiency.

In one implementation, a back-illuminated CCD detector is used in direct detection mode, without any secondary scintillation or magnification. A number of commercially available detectors are well suited for the AIM application. In one implementation, an Andor CCD detector with 1K×1K pixels, each with 13×13 μm size. The quantum efficiency of such a CCD detector is about 50% at 13.4 nm wavelength. The 13 μm detector pixel size leads to a convenient magnification of 650 in the AIM mode with 20 nm pixel size on sample. Its full-well capacity is about 100,000 electrons. Since each EUV photon creates about 40 electron-hole pairs, a dynamic range of 2,500 for EUV photon detection can be expected, corresponding to a few tenth of second exposure time in the AIM modes, and a few second exposure time in the high-resolution mode.

Figure 24:
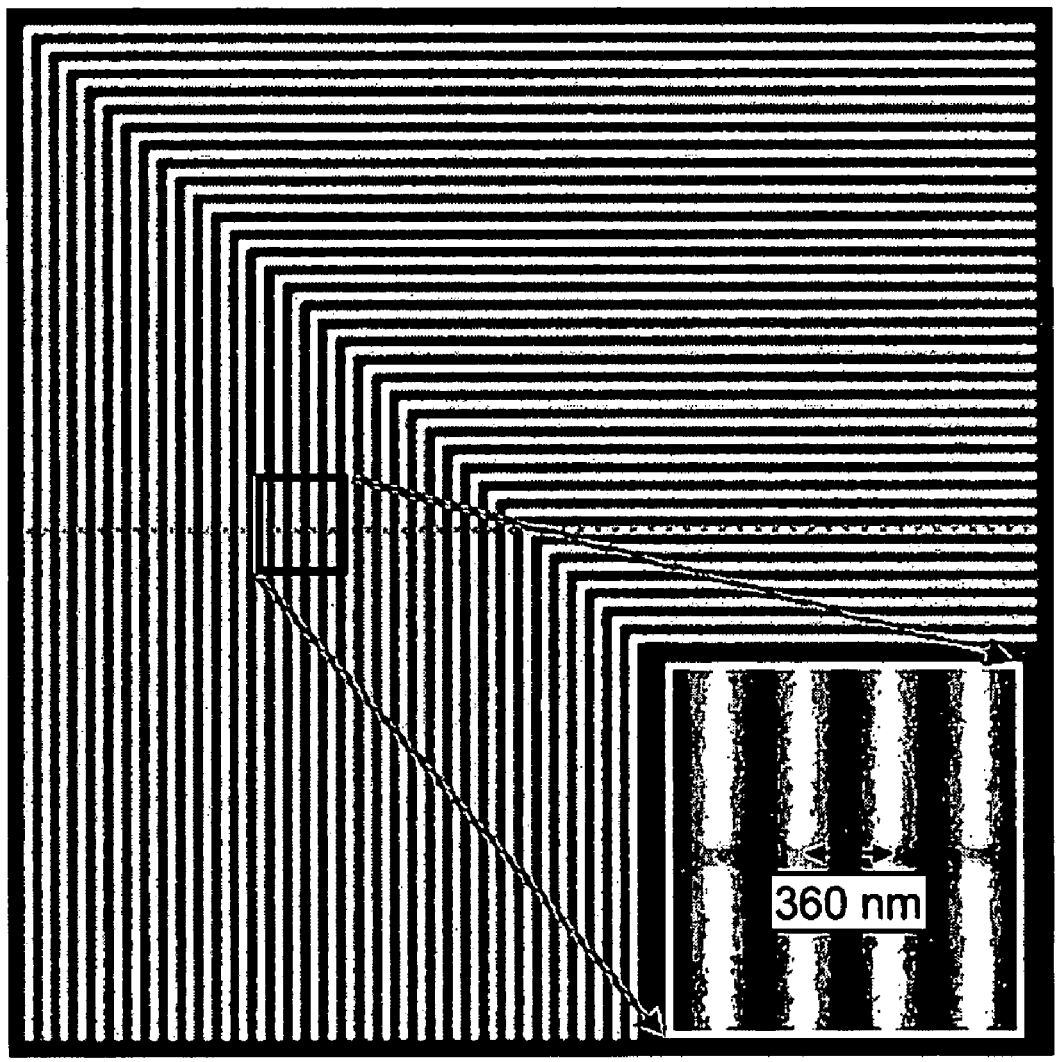
FIG. 24 is a simulated AIM imaging performance using a mask pattern consisting of 90-degree elbows across the field of view.

We have simulated the AIM imaging performance for the previously described optical system at the 45 nm node. We assume Kohler illumination, 3000 counts per 20 nm pixel and a 6-degree tilt across the 20 micrometer field of view. We added a uniform 2% background to account for scattering in the reflective optics. We accounted for the tilt by calculating the three-dimensional intensity distribution near focus in the paraxial approximation and then convolving the intensity distribution as a function of depth with the mask pattern. The mask pattern consists of 90-degree elbows across the field of view as shown in FIG. 24. The line width is 180 nm, with 180 nm spacings. In addition, we have inserted a linear pattern of 60 nm amplitude defects spaced 360 nm apart across the field of view. The defects can be clearly identified from the image with a contrast of:

$$C = \frac{I_{Max} - I_{Min}}{I_{Max} + I_{Min}} \approx 0.14$$

The tilt of the mask introduces negligible problems in this imaging geometry.

To calculate the throughput of the AIM tool, we make the following assumptions:

| B | source brightness | 1 W in-band power | $10^{17}$ γ/(s mm² str) |
|---|---|---|---|
| $\eta_C$ | condenser efficiency | multilayer condenser | 50% |
| σ | pixel size | 400 nm² | 20 nm pixels |
| $\eta_M$ | mask reflectivity | multilayer reflectivity | 60% |
| $\eta_Z$ | objective efficiency | AFO for AIM mode | 25% |
| $\eta_D$ | detector efficiency | back-illuminated CCD | 50% |
| Ω | angular acceptance | objective with 0.075 NA | 0.0175 |
| $\eta_F$ | debris filter efficiency | thin Si₃N₄ membrane | 75% |

The intensity on a detector pixel can be expressed as:

$$I = B\eta_C \sigma \eta_M \eta_Z \eta_D \eta_F \Omega.$$

Using figures from the above list, the tool is able to collect on the order of $10^4$ photons per pixel per second. Multilayer surfaces typically generate about 1% of background emitted primarily within 3 degrees from normal. Flare and non-imaging diffraction order from the objective can be removed by the use of the apertures and stops and will be ignored in this calculation. With an exposure time of T seconds, the signal levels is $10^4 \times T$, the flare from the two multilayers is on the order of 100×T, and the shot noise is on the order of $100 \times \sqrt{T}$. This signal to noise ratio is therefore:

$$SNR = \frac{10^4 \times T}{100 \times \sqrt{T^2 + T}} = \frac{100}{\sqrt{1 + \frac{1}{T}}}$$

From this formula, images with good signal to noise ratio of over 70 can be obtained with an exposure time of 1 second. In the high-resolution mode, the pixel size is reduced by a factor of 4, the objective efficiency is reduced by a factor of 5, the numerical aperture is increase by a factor of 3, and the amount of flare is increased by a factor of 3. An exposure time of about 10 seconds will be sufficient. Since the CCD detector has a full well capacity that is equivalent to about 2,500 EUV photons, it may be necessary to take a number of image and them sum them in order to increase the dynamic range of the detection system. It is also worth noting that with a slightly brighter source, a 20 mW source with 20 um size for example, a nearly real-time exposure rate can be achieved.

Figure 25:
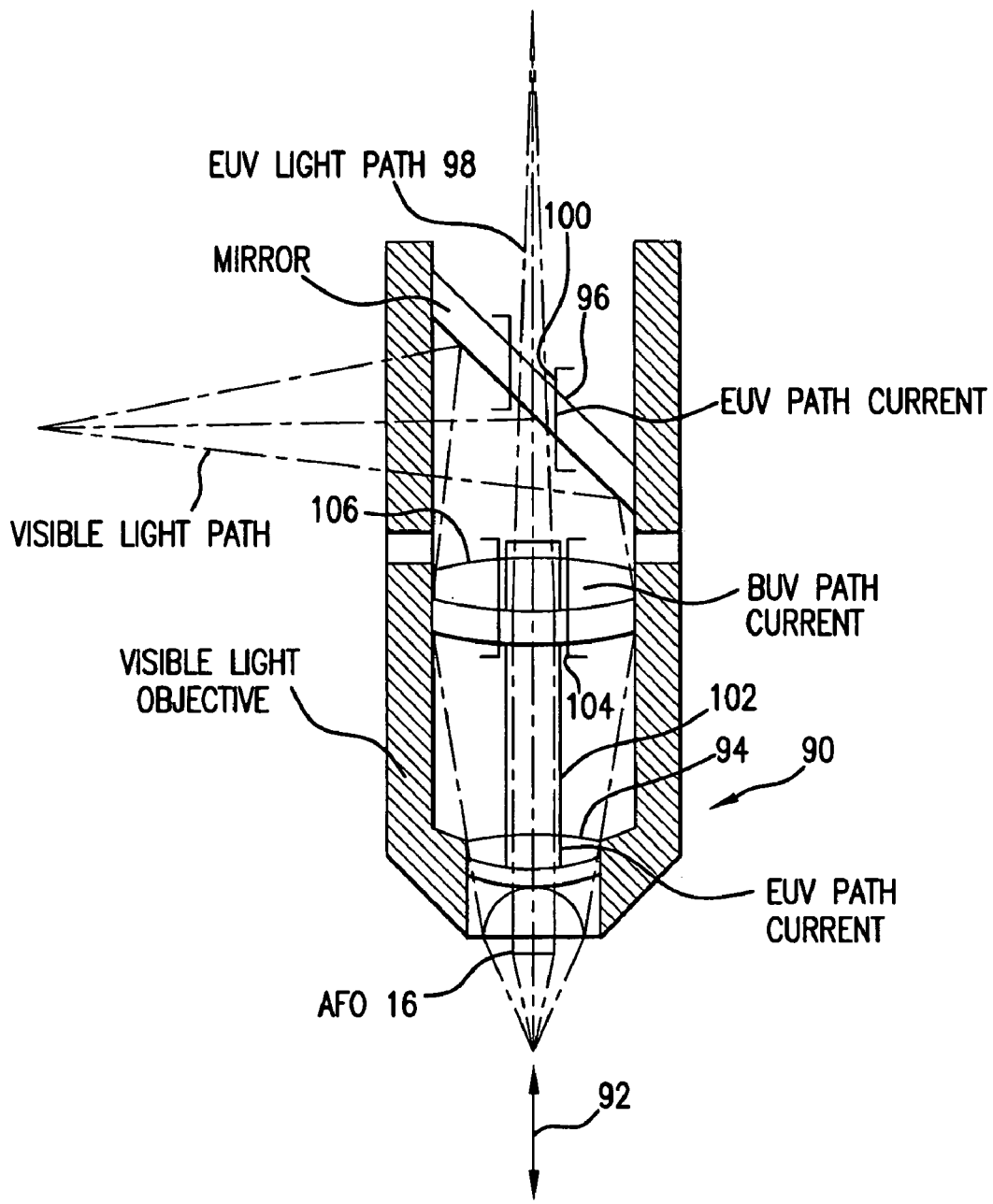
FIG. 25 is a cross-sectional view showing an integrated AFO with a visible light objective.

The AFO lens 16 is not directly compatible with visible light imaging. We plan to integrate the AFO with a visible light objective as shown in FIG. 25 so that EUV and visible light can be used simultaneously and will have a common focal plane. In this scheme, a high-NA visible light objective 90 drilled out from the center along its optical axis 92. Specifically holes 102 and 104 are formed in the visible light objective lens 94 and a visible light tube lens 106. Then an AFO 16 is integrated into the front of the objective and is par-focal with the visible-light lens 94. A deflection mirror 96 is placed behind the objective to direct the visible light 90° from the EUV beam path 98. The mirror will have a cutout 100 in the center as well to allow the EUV light to pass through it. The numerical aperture of the AIM AFO 16 is up to 0.0875, and the NA of the visible light lens 94 will be 0.75-0.9, therefore both the illumination and imaging beam paths of the EUV light can fit into a cutout of the visible-light objective.

Since the AFO has the common focal point as the visible light objective, we will use the visible light mode to detect the fiducial marks and obtain visible light images at up to 0.3 μm resolution.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optical system comprising:
   an extreme ultraviolet radiation source;
   a spectral filter that filters ultraviolet radiation generated by the source;
   a reflective condenser that directs the ultraviolet radiation onto a sample at an angle of between normal to the sample and 7 degrees off normal;
   an aperture for spatially filtering the ultraviolet radiation;
   an objective lens comprising a Fresnel zone plate lens that forms an image of the ultraviolet radiation from the sample; and
   a spatially resolved detector for detecting the image of the sample formed by the objective lens.

2. An optical system as claimed in claim 1, wherein the ultraviolet radiation has a wavelength of 13 to 14 nanometers and the objective comprises a zone plate made from molybdenum (Mo), niobium (Nb), Technetium (Tc), or Ruthenium (Ru).

3. An optical system as claimed in claim 1, wherein the source is a laser-plasma source.

4. An optical system as claimed in claim 1, wherein the source is a gas discharge source.

5. An optical system as claimed in claim 1, wherein the spectral filter is a multilayer notch filter.

6. An optical system as claimed in claim 1, wherein the condenser is a multilayer coated spherical surface.

7. An optical system as claimed in claim 1, wherein the detector is a CCD camera.

8. An optical system as claimed in claim 1, wherein the detector is a CMOS camera.

9. An optical system as claimed in claim 1, wherein the source uses emission from a copper target.

10. An optical system as claimed in claim 1, wherein the sample is a lithography mask.

11. An optical system as claimed in claim 1, wherein the ultraviolet radiation has a wavelength of 13 to 14 nanometers and the objective comprises a zone plate made from molybdenum (Mo).

12. An optical system as claimed in claim 1, wherein the ultraviolet radiation has a wavelength of 13 to 14 nanometers and the objective comprises a zone plate made from niobium (Nb).

13. An optical system as claimed in claim 1, wherein the ultraviolet radiation has a wavelength of 13 to 14 nanometers and the objective comprises a zone plate made from technetium (Tc).

14. An optical system as claimed in claim 1, wherein the ultraviolet radiation has a wavelength of 13 to 14 nanometers and the objective comprises a zone plate made from ruthenium (Ru).

15. An optical system comprising:
an extreme ultraviolet radiation source;
a spectral filter that filters ultraviolet radiation generated by the source;
a reflective condenser that directs the ultraviolet radiation onto a sample at an angle of between normal to the sample and 7 degrees off normal;
an aperture for spatially filtering the ultraviolet radiation;
an objective lens that forms an image of the ultraviolet radiation from the sample; and
a spatially resolved detector for detecting the image of the sample formed by the objective lens; and
wherein a virtual source of the extreme ultraviolet radiation source formed by the condenser and a region of interest of the sample, which is a mask, reside on a Rowland circle determined by the condenser.

16. An optical system comprising:
an extreme ultraviolet radiation source;
a spectral filter that filters ultraviolet radiation generated by the source;
a reflective condenser that directs the ultraviolet radiation onto a sample at an angle of between normal to the sample and 7 degrees off normal;
an aperture for spatially filtering the ultraviolet radiation;
an objective lens that forms an image of the ultraviolet radiation from the sample; and
a spatially resolved detector for detecting the image of the sample formed by the objective lens; and
wherein the objective lens comprises an achromatic Fresnel optic with a silicon refractive lens.

17. An optical system comprising:
an extreme ultraviolet radiation source;
a spectral filter that filters ultraviolet radiation generated by the source;
a reflective condenser that directs the ultraviolet radiation onto a sample at an angle of between normal to the sample and 7 degrees off normal;
an aperture for spatially filtering the ultraviolet radiation;
an objective lens that forms an image of the ultraviolet radiation from the sample; and
a spatially resolved detector for detecting the image of the sample formed by the objective lens; and
wherein the objective lens comprises an achromatic Fresnel optic with a refractive lens made from copper.

* * * * *